(12) United States Patent
Iida et al.

(10) Patent No.: US 7,940,234 B2
(45) Date of Patent: May 10, 2011

(54) PIXEL CIRCUIT, DISPLAY DEVICE, AND METHOD OF MANUFACTURING PIXEL CIRCUIT

(75) Inventors: Yukihito Iida, Kanagawa (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 806 days.

(21) Appl. No.: 11/980,451

(22) Filed: Oct. 31, 2007

(65) Prior Publication Data

US 2008/0117146 A1     May 22, 2008

(30) Foreign Application Priority Data

Nov. 17, 2006   (JP) ................................. 2006-311494

(51) Int. Cl.
     *G09G 3/30*      (2006.01)
(52) U.S. Cl. ......................................... 345/76; 345/211
(58) Field of Classification Search ............... 345/76–84, 345/90–100, 204–215
See application file for complete search history.

(56) References Cited

U.S. PATENT DOCUMENTS

| 5,684,365 | A | 11/1997 | Tang et al. | |
| 2006/0279478 | A1* | 12/2006 | Ikegami | 345/30 |
| 2008/0068359 | A1* | 3/2008 | Yoshida et al. | 345/204 |

FOREIGN PATENT DOCUMENTS

| JP | 08-234683 | 9/1996 |
| JP | 2003-271095 A | 9/2003 |
| JP | 2003-330387 | 11/2003 |
| JP | 2005-141213 | 6/2004 |
| JP | 2005-103339 | 4/2005 |
| JP | 2005-227618 | 8/2005 |
| JP | 2006-148040 | 6/2006 |
| JP | 2006-215086 | 8/2006 |
| JP | 2006-276143 | 10/2006 |

OTHER PUBLICATIONS

Japanese Office Action issued Dec. 2, 2008 for corresponding Japanese Application No. 2006-311494.

* cited by examiner

*Primary Examiner* — Vijay Shankar
(74) *Attorney, Agent, or Firm* — Rader, Fishman & Grauer PLLC

(57) ABSTRACT

A pixel circuit including: a driving transistor; a light emitting element; and a power supply line; wherein the driving transistor is connected between the power supply line and a predetermined electrode of the light emitting element, and the power supply line is formed as multilayer wiring, and an interpolating capacitance is formed such that the power supply line formed as the multilayer wiring and another conductive layer are opposed to each other at a distance.

12 Claims, 20 Drawing Sheets

MULTILAYER WIRING PROCESS-1
(EXAMPLE OF USING OXIDE FILM AS INTERLAYER FILM)

FORM GATE ELECTRODE
(FIRST WIRING)

FORM GATE INSULATING
FILM (SiO$_2$) AND
AMOLPHOUS Si FILM
PERFORM
POLYCRYSTALLIZATION
FORM SOURCE AND DRAIN

FORM INSULATING FILM
(SiO$_2$)

MAKE CONTACT HOLES

FORM SOURCE AND DRAIN
ELECTRODES
(SECOND WIRING)

MULTILAYER WIRING PROCESS-2
(EXAMPLE OF USING OXIDE FILM AS INTERLAYER FILM)

FORM INTERLAYER FILM

MAKE CONTACT HOLES

FORM LOW-RESISTANCE ELECTRODES (THIRD WIRING)

MULTILAYER WIRING PROCESS-3
(EXAMPLE OF USING OXIDE FILM AS INTERLAYER FILM)

FORM PLANARIZING FILM

FORM ANODE ELECTRODE

MULTILAYER WIRING PROCESS-1
(EXAMPLE OF USING PHOTOSENSITIVE RESIN AS INTERLAYER FILM)

FORM GATE ELECTRODE
(FIRST WIRING)

FORM GATE INSULATING
FILM (SiO₂) AND
AMORPHOUS Si FILM
PERFORM
POLYCRYSTALLIZATION
FORM SOURCE AND DRAIN

FORM INSULATING FILM
(SiO₂)

MAKE CONTACT HOLES

FORM SOURCE AND DRAIN
ELECTRODES
(SECOND WIRING)

MULTILAYER WIRING PROCESS-2
(EXAMPLE OF USING PHOTOSENSITIVE RESIN AS INTERLAYER FILM)

FORM INTERLAYER FILM

FORM LOW-RESISTANCE ELECTRODES (THIRD WIRING)

MULTILAYER WIRING PROCESS-3
(EXAMPLE OF USING PHOTOSENSITIVE RESIN AS INTERLAYER FILM)

FORM PLANARIZING FILM

FORM ANODE ELECTRODE

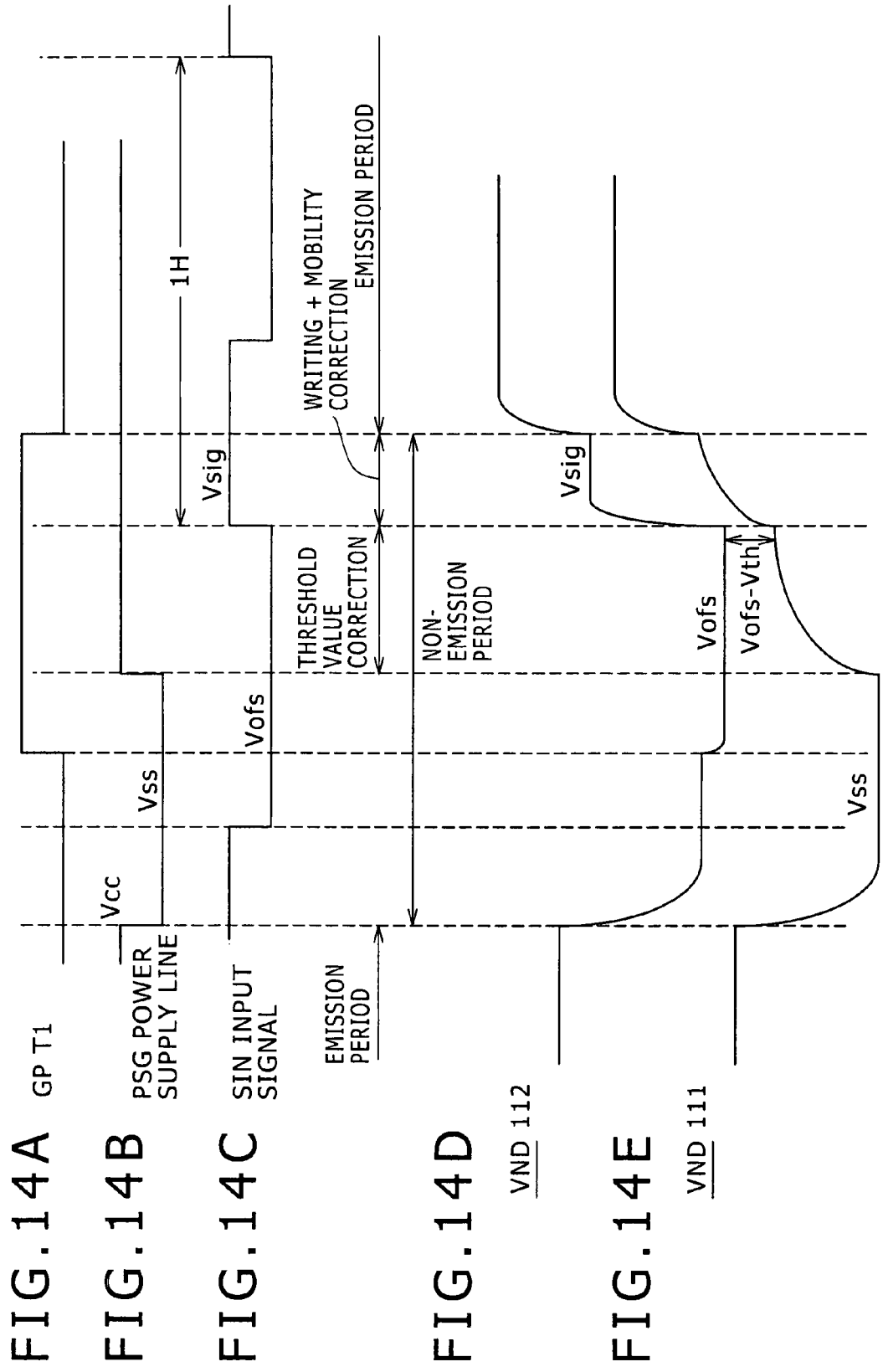

PIXEL CIRCUIT, DISPLAY DEVICE, AND METHOD OF MANUFACTURING PIXEL CIRCUIT

CROSS REFERENCES TO RELATED APPLICATIONS

The present invention contains subject matter related to Japanese Patent Application JP 2006-311494 filed in the Japan Patent Office on Nov. 17, 2006, the entire contents of which being incorporated herein by reference.

BACKGROUND OF THE INVENTION

1. Field of the Invention

The present invention relates to a pixel circuit including an organic EL (Electroluminescence) light emitting element or the like, an active matrix type display device, and a method of manufacturing the pixel circuit.

2. Description of the Related Art

In an image display device, for example, a liquid crystal display, a large number of pixels are arranged in the form of a matrix, and light intensity is controlled for each pixel according to information on an image to be displayed, whereby the image is displayed.

While the same is true for an organic EL display or the like, the organic EL display is a so-called emissive display having a light emitting element in each pixel circuit and has advantages of providing higher image viewability, eliminating a need for a backlight, and having higher response speed, for example, as compared with the liquid crystal display.

In addition, the organic EL display differs greatly from the liquid crystal display or the like in that the luminance of each light emitting element is controlled by the value of a current flowing through the light emitting element, and thereby color gradation is obtained, that is, in that the light emitting element is of a current-controlled type.

As in the liquid crystal display, there are a simple matrix system and an active matrix system as possible driving systems of the organic EL display. The former has a simple structure, but presents problems including, for example, a difficulty in realizing a large high-definition display. Therefore, the active matrix system, which controls a current flowing through a light emitting element within a pixel circuit by an active element, or typically a TFT (Thin Film Transistor), provided within the pixel circuit, has been actively developed.

FIG. 1 is a block diagram showing a configuration of an ordinary organic EL display device.

As shown in FIG. 1, this display device 1 includes: a pixel array unit 2 having pixel circuits (PXLC) 2a arranged in the form of an m×n matrix; a horizontal selector (HSEL) 3; a write scanner (WSCN) 4; signal lines (data lines) SGL1 to SGLn selected by the horizontal selector 3 and supplied with a data signal corresponding to luminance information; and scanning lines WSL1 to WSLm selected and driven by the write scanner 4.

Incidentally, the horizontal selector 3 and the write scanner 4 may be formed on polycrystalline silicon, or formed by a MOSIC or the like on the periphery of the pixels.

FIG. 2 is a circuit diagram showing an example of configuration of a pixel circuit 2a in FIG. 1 (see U.S. Pat. No. 5,684,365 and Japanese Patent Laid-Open No. Hei 8-234683, for example).

The pixel circuit of FIG. 2 has a simplest circuit configuration among a large number of circuits that have been proposed, and is a circuit of a so-called two-transistor driving system.

The pixel circuit 2a of FIG. 2 includes a p-channel thin film field effect transistor (hereinafter referred to as a TFT) 11 and a TFT 12, a capacitor C11, and an organic EL light emitting element (OLED) 13 as a light emitting element. In FIG. 2, SGL denotes a signal line, and WSL denotes a scanning line.

The organic EL light emitting element has a current rectifying property in many cases, and may therefore be referred to as an OLED (Organic Light Emitting Diode). Although the symbol of a diode is used for a light emitting element in FIG. 2 and other figures, the current rectifying property is not necessarily required of an OLED in the following description.

In FIG. 2, the source of the TFT 11 is connected to a power supply potential Vcc. The cathode of the light emitting element 13 is connected to a ground potential GND. The operation of the pixel circuit 2a of FIG. 2 is as follows.

Step ST1:

When the scanning line WSL is set in a selected state (a low level in this case), and a writing potential Vdata is applied to the signal line SGL, the TFT 12 conducts to charge or discharge the capacitor C11, and the gate potential of the TFT 11 becomes the writing potential Vdata.

Step ST2:

When the scanning line WSL is set to a non-selected state (a high level in this case), the signal line SGL and the TFT 11 are electrically disconnected from each other. However, the gate potential of the TFT 11 is maintained stably by the capacitor C11.

Step ST3:

A current flowing through the TFT 11 and the light emitting element 13 has a value corresponding to the gate-to-source voltage Vgs of the TFT 11, and the light emitting element 13 continues emitting light at a luminance corresponding to the current value.

An operation of selecting the scanning line WSL and transmitting the luminance information supplied to the data line to the inside of the pixel as in the above-described step ST1 will hereinafter be referred to as "writing."

As described above, once the writing potential Vdata is written in the pixel circuit 2a of FIG. 2, the light emitting element 13 continues emitting light at a constant luminance until the writing potential Vdata is next rewritten.

As described above, in the pixel circuit 2a, the value of the current flowing through the light emitting element 13 is controlled by changing the voltage applied to the gate of the TFT 11 as a driving (drive) transistor.

At this time, the source of the p-channel drive transistor is connected to the power supply potential Vcc, and the TFT 11 operates in a saturation region at all times. The TFT 11 is therefore a constant-current source having a value expressed by the following Equation 1.

(Equation 1)

$$Ids = \tfrac{1}{2} \cdot \| (W/L) \text{Cox} (Vgs - |Vth|)^2 \quad (1)$$

where $\mu$ denotes carrier mobility, Cox denotes gate capacitance per unit area, W denotes gate width, L denotes gate length, Vgs denotes the gate-to-source voltage of the TFT 11, and Vth denotes the threshold voltage of the TFT 11.

Each light emitting element in a simple matrix type image display device emits light only at a moment when the light emitting element is selected. On the other hand, the light emitting element in the active matrix system continues emitting light even after writing is ended, as described above. The active matrix system is therefore advantageous especially in a large high-definition display in that the peak luminance and the peak current of the light emitting element can be decreased as compared with the simple matrix system.

FIG. 3 is a diagram showing a secular change in the current-voltage (I-V) characteristic of the organic EL light emitting element. In FIG. 3, a curve represented as a solid line indicates a characteristic at a time of an initial state, and a curve represented as a broken line indicates a characteristic after a secular change.

Generally, as shown in FIG. 3, the I-V characteristic of the organic EL light emitting element is degraded with the passage of time.

However, because the two-transistor driving of FIG. 2 is constant-current driving, a constant current continues flowing through the organic EL light emitting element as described above, and the light emission luminance of the organic EL light emitting element is not degraded with time even when the I-V characteristic of the organic EL light emitting element is degraded.

The pixel circuit 2a of FIG. 2 is formed with p-channel TFTs. When the pixel circuit 2a of FIG. 2 can be formed with n-channel TFTs, an existing amorphous silicon (a-Si) process can be used in TFT fabrication. Thereby the cost of a TFT substrate can be reduced.

A description will next be made of a basic pixel circuit in which the transistors are replaced with re-channel TFTs.

FIG. 4 is a circuit diagram showing a pixel circuit in which the p-channel TFTs in the circuit of FIG. 2 are replaced with n-channel TFTs.

The pixel circuit 2b of FIG. 4 includes n-channel TFTs 21 and 22, a capacitor C21, and an organic EL light emitting element (OLED) 23 as a light emitting element. In FIG. 4, SGL denotes a data line, and WSL denotes a scanning line.

In this pixel circuit 2b, the drain side of the TFT 21 as a drive transistor is connected to a power supply potential Vcc, and the source of the TFT 21 is connected to the anode of the EL light emitting element 23, whereby a source follower circuit is formed.

FIG. 5 is a diagram showing an operating point of the TFT 21 as a drive transistor and the EL light emitting element 23 in an initial state. In FIG. 5, an axis of abscissas indicates the drain-to-source voltage Vds of the TFT 21, and an axis of ordinates indicates the drain-to-source current Ids of the TFT 21.

As shown in FIG. 5, source voltage is determined by the operating point of the TFT 21 as a drive transistor and the EL light emitting element 23, and the voltage has a different value depending on gate voltage.

Because the TFT 21 is driven in a saturation region, the TFT 21 passes the current Ids having the current value of the equation shown as the above Equation 1 relating to the gate-to-source voltage Vgs corresponding to the source voltage at the operating point.

SUMMARY OF THE INVENTION

The above-described pixel circuit is the simplest circuit including the TFT 21 as a driving (drive) transistor, the TFT 22 as a switching transistor, and the OLED 23. However, a configuration may be employed in which switching is performed between two signals as a power signal applied to the power supply line, and switching is also performed between two signals as a video signal supplied to the signal line, thereby correcting a threshold value and mobility.

Alternatively, a configuration may be employed which has a TFT or the like for mobility and threshold value cancellation separately in addition to the drive (driving) transistor connected in series with the OLED and the switching transistor.

For the TFT as a switching transistor or the TFT provided separately for the threshold value or mobility, a vertical scanner such as a write scanner disposed on both sides or one side of an active matrix type organic EL display panel generates a gate pulse. The pulse signal is applied via wiring to the gate of a desired TFT in pixel circuits arranged in a matrix.

When this pulse signal is applied to two or more TFTs, timing of application of each pulse signal becomes important.

However, shading or stripe nonuniformity is caused by a pulse delay, a transient change, and a voltage drop in the power supply line due to the effect of wiring resistance and wiring capacitance of the driving wiring and the power supply line connected to the pixel circuit. As a result, the shading or the stripe nonuniformity can occur as nonuniformity or graininess in an image.

These problems have greater effect as the size or the degree of definition of the panel is increased.

It is accordingly desirable to provide a pixel circuit, a display device, and a method of manufacturing the pixel circuit that can suppress the occurrence of shading, stripe nonuniformity and the like, and which can provide a high quality image.

According to a first embodiment of the present invention, there is provided a pixel circuit including: a driving transistor; a light emitting element; and a power supply line; wherein the driving transistor is connected between the power supply line and a predetermined electrode of the light emitting element, and the power supply line is formed as multilayer wiring.

According to a second embodiment of the present invention, there is provided a display device including: a pixel array unit in which a plurality of pixel circuits are formed, the pixel circuits each including a light emitting element, a power supply line, a driving transistor connected between the power supply line and a predetermined electrode of the light emitting element, and a switching transistor connected between a signal line and a gate electrode of the driving transistor; a first scanner for supplying a potential to the power supply line; and a second scanner for outputting a driving signal to the switching transistor; wherein the power supply line is formed as multilayer wiring.

According to the embodiments of the present invention, low resistance of the power supply line is achieved by forming the power supply line as multilayer wiring. A voltage drop in the wiring for power supply is thereby suppressed.

According to the embodiments of the present invention, it is possible to suppress the occurrence of shading, stripe nonuniformity and the like, and provide a high quality image.

BRIEF DESCRIPTION OF THE DRAWINGS

FIG. 9 is a sectional view of assistance in explaining an example of a measure to improve picture quality and the like;

FIGS. 14A, 14B, 14C, 14D, and 14E are timing charts showing a concrete operation of the pixel circuit of FIG. 7;

DETAILED DESCRIPTION OF THE PREFERRED EMBODIMENTS

Preferred embodiments of the present invention will hereinafter be described with reference to the drawings.

Figure 1:
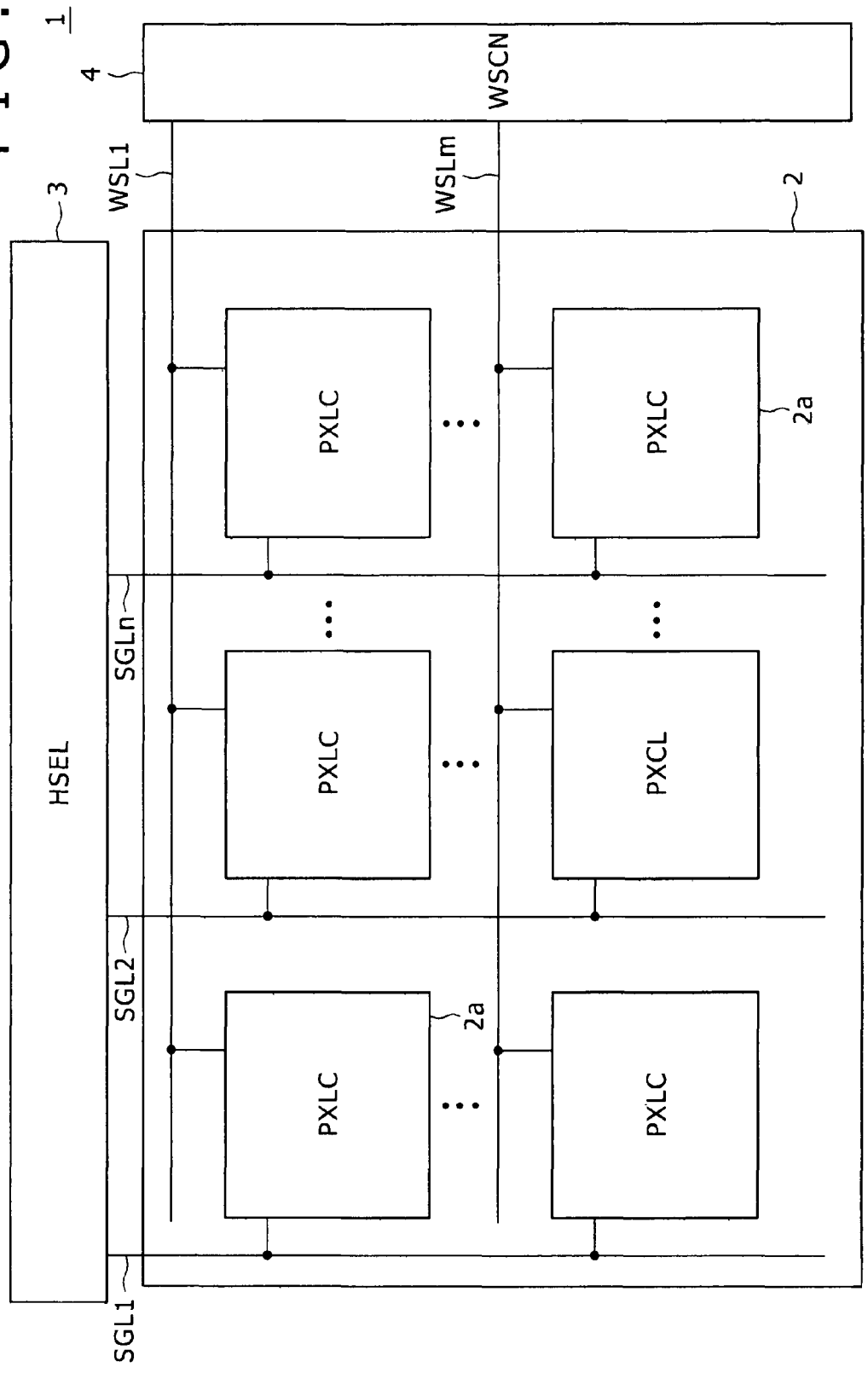
FIG. 1 is a block diagram showing a configuration of an ordinary organic EL display device.
Figure 2:
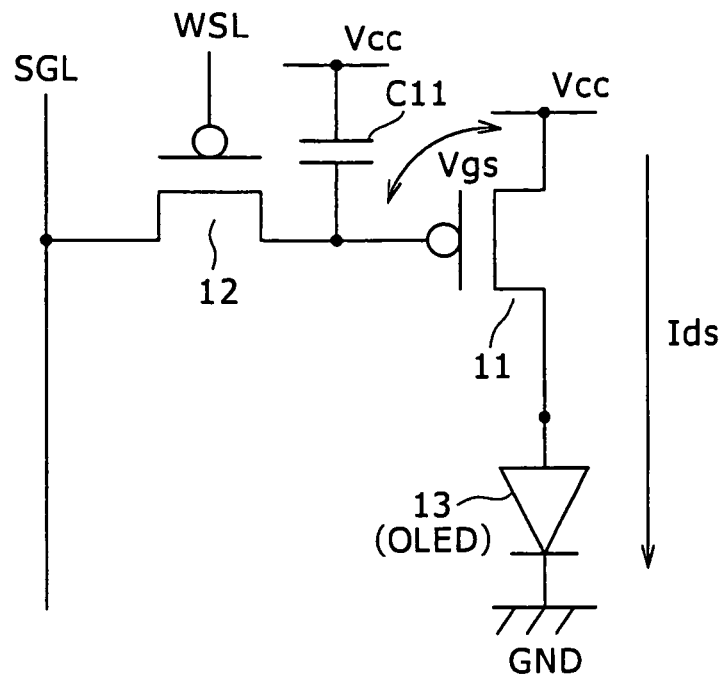
FIG. 2 is a circuit diagram showing an example of a configuration of a pixel circuit in FIG. 1.
Figure 3:
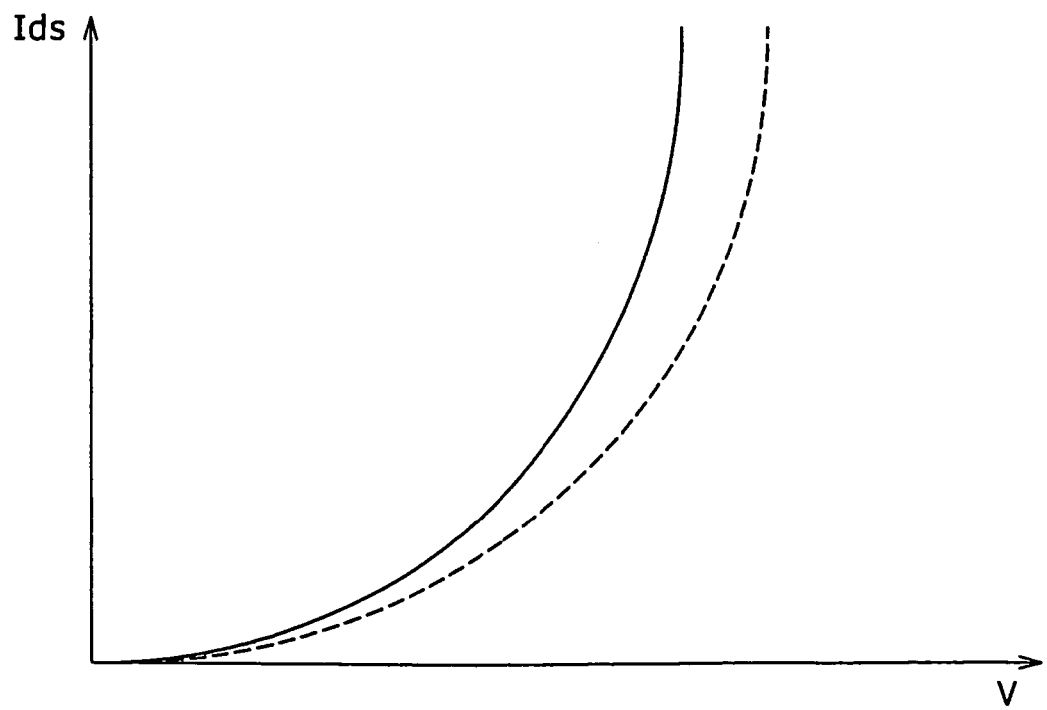
FIG. 3 is a diagram showing a secular change in the current-voltage (I-V) characteristic of an organic EL light emitting element.
Figure 4:
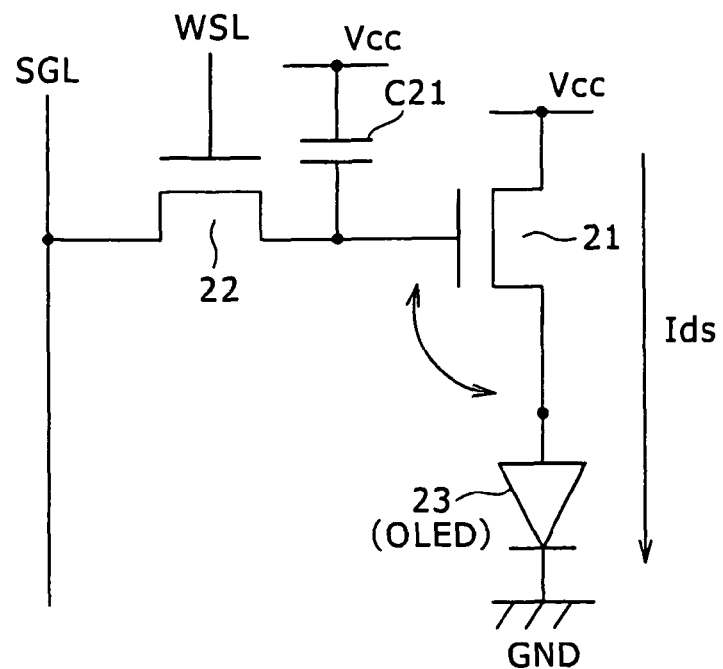
FIG. 4 is a circuit diagram showing a pixel circuit in which p-channel TFTs in the circuit of FIG. 2 are replaced with n-channel TFTs.
Figure 5:
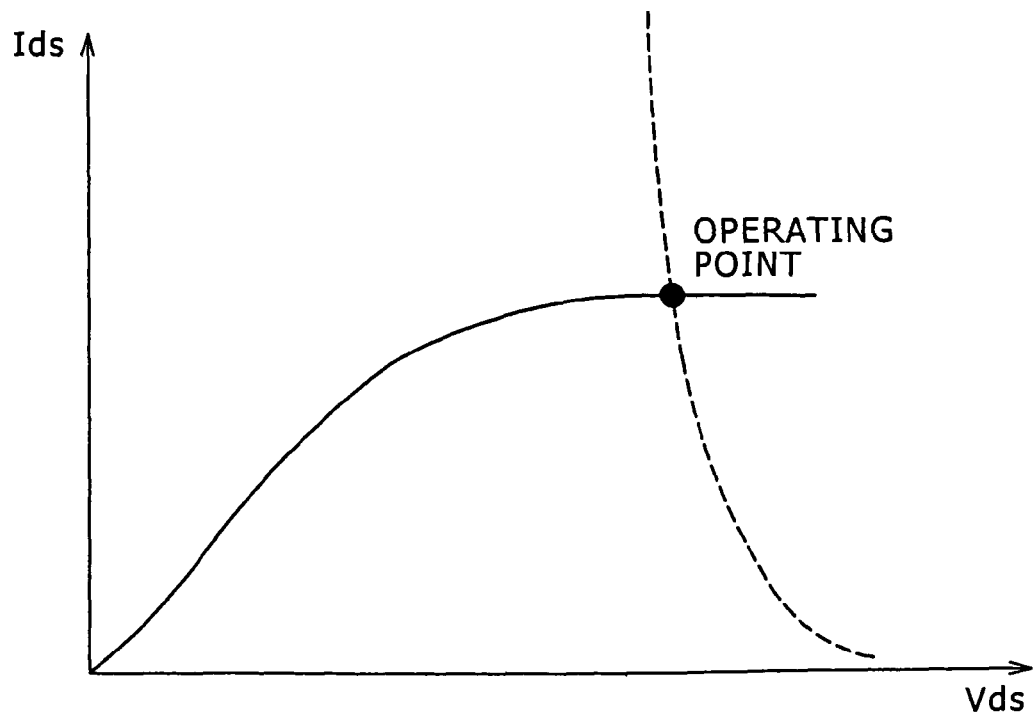
FIG. 5 is a diagram showing an operating point of a TFT as a drive transistor and an EL light emitting element in an initial state.
Figure 6:
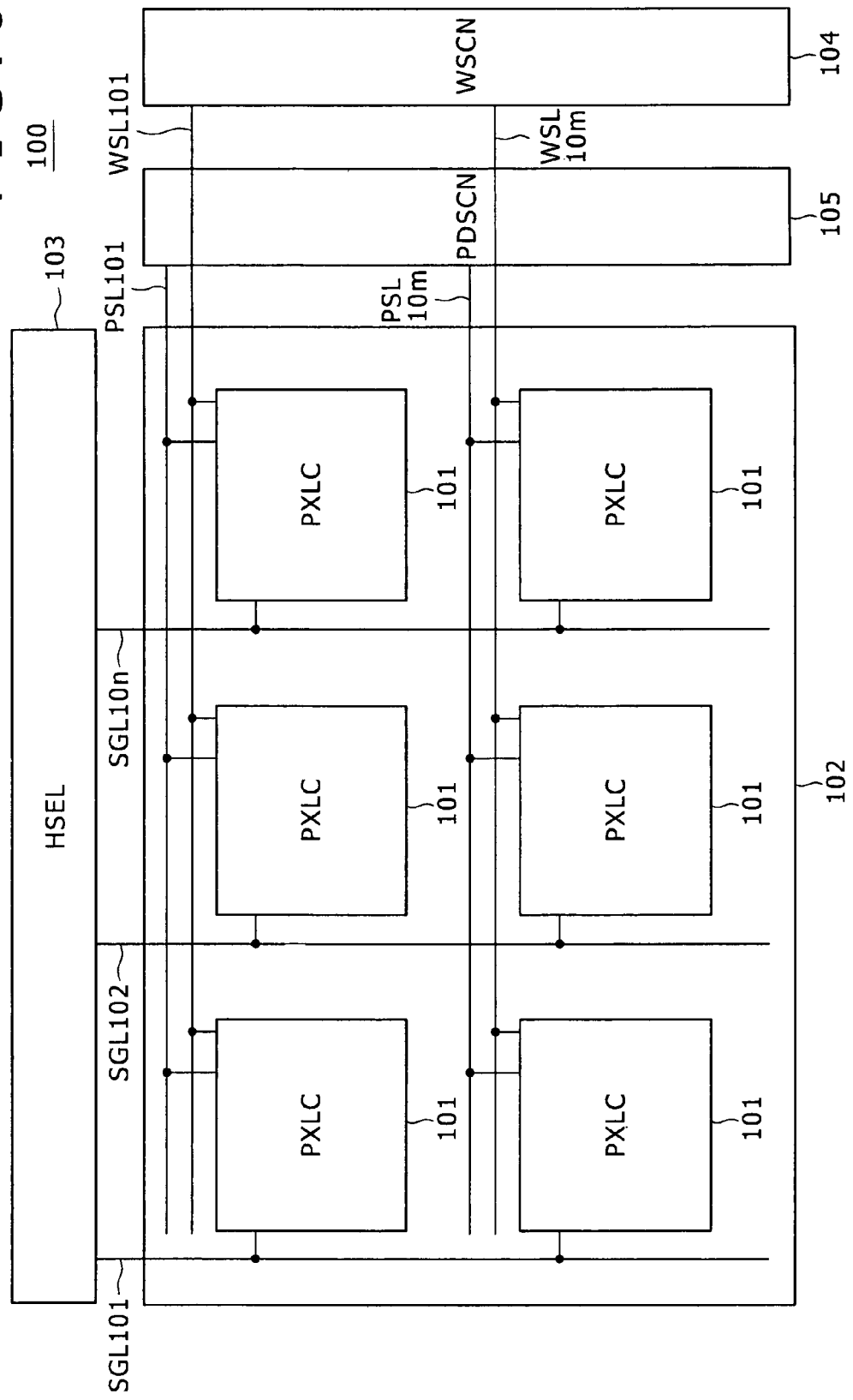
FIG. 6 is a block diagram showing a configuration of an organic EL display device employing a pixel circuit according to an embodiment of the present invention.

FIG. 6 is a block diagram showing a configuration of an organic EL display device using a pixel circuit according to a first embodiment of the present invention.

Figure 7:
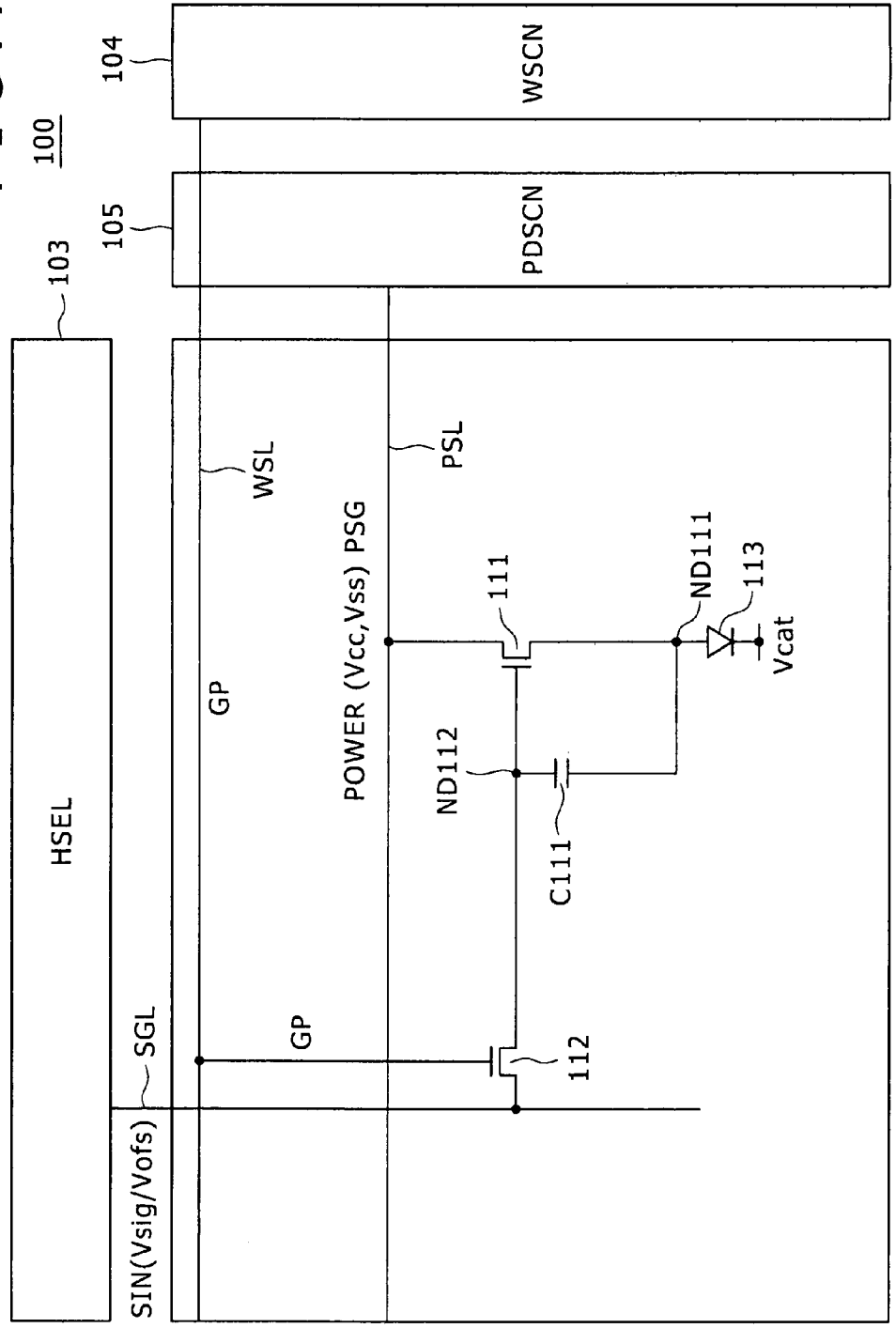
FIG. 7 is a circuit diagram showing a concrete configuration of the pixel circuit according to the present embodiment.

FIG. 7 is a circuit diagram showing a concrete configuration of a pixel circuit according to the first embodiment.

As shown in FIG. 6 and FIG. 7, this display device 100 includes: a pixel array unit 102 having pixel circuits 101 arranged in the form of an m×n matrix; a horizontal selector (HSEL) 103; a write scanner (WSCN) 104 as a second scanner; a power drive scanner (PDSCN) 105 as a first scanner; signal lines SGL101 to SGL10$n$ selected by the horizontal selector 103 and supplied with an input signal SIN of a data signal Vsig corresponding to luminance information and an offset signal Vofs; scanning lines WSL101 to WSL10$m$ as driving wiring selected and driven by a gate pulse (scanning pulse) GP of the write scanner 104; and power driving lines PSL101 to PSL10$m$ as driving wiring driven by being supplied with a power signal PSG selectively set to a voltage Vcc (for example, a power supply voltage) or a voltage Vss (for example, a negative side voltage) by the power drive scanner 105.

Incidentally, while the pixel circuits 101 are arranged in the form of an m×n matrix in the pixel array unit 102, FIG. 6 shows an example in which pixel circuits 101 are arranged in the form of a 2(=m)×3(=n) matrix for simplicity of the figure.

In addition, FIG. 7 shows a concrete configuration of one pixel circuit for simplicity of the figure.

As shown in FIG. 7, a pixel circuit 101 according to the present embodiment includes: an n-channel TFT 111 as a driving transistor; an n-channel TFT 112 as a switching transistor; a capacitor C111; a light emitting element 113 formed by an organic EL light emitting element (OLED: an electrooptic element); a first node ND111; and a second node ND112.

In the pixel circuit 101, the TFT 111 as the driving transistor, the node ND111, and the light emitting element (OLED) 113 are connected in series with each other between the power driving line (power supply line) PSL (101 to 10$m$) and a predetermined reference potential Vcat (for example, a ground potential).

Specifically, the cathode of the light emitting element 113 is connected to the reference potential Vcat. The anode of the light emitting element 113 is connected to the first node ND111. The source (for example, a second electrode) of the TFT 111 is connected to the first node ND111. The drain (for example, a first electrode) of the TFT 111 is connected to the power driving line PSL.

The gate of the TFT 111 is connected to the second node ND112.

The first electrode of the capacitor C111 is connected to the first node ND111. The second electrode of the capacitor C111 is connected to the second node ND112.

The source and the drain of the TFT 112 are connected between the signal line SGL and the second node ND112, respectively. The gate of the TFT 112 is connected to the scanning line WSL.

Thus, the pixel circuit 101 according to the present embodiment has the capacitor C111 as a pixel capacitance connected between the gate and the source of the TFT 111 as a drive transistor.

Figure 8:
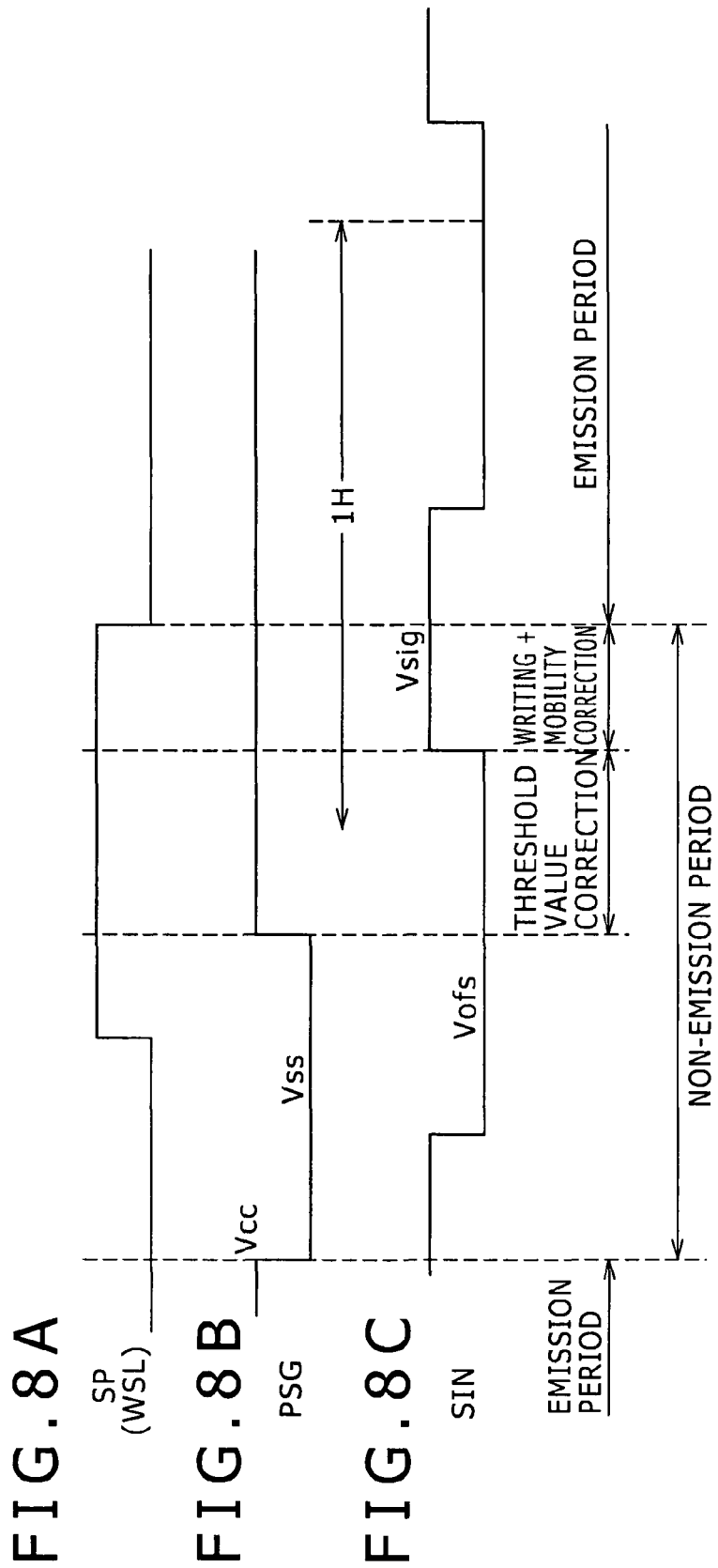
FIGS. 8A, 8B, and 8C are timing charts showing a basic operation of the pixel circuit of FIG. 7.

FIGS. 8A to 8C are a timing chart showing a basic operation of the pixel circuit in FIG. 7.

FIG. 8A shows the gate pulse (scanning pulse) GP applied to the scanning line WSL. FIG. 8B shows the power signal PSG applied to the power driving line PSL. FIG. 8C shows the input signal SIN applied to the signal line SGL.

For light emission of the light emitting element 113 in the pixel circuit 101, during a non-emission period, as shown in FIGS. 8A to 8C, a power signal Vss (for example, a negative voltage) is applied to the power driving line PSL, and an offset signal Vofs is propagated through the signal line SGL, and then input to the second node ND112 via the TFT 112. Thereafter, a power signal Vcc (corresponding to a power supply voltage) is applied to the power driving line PSL. Thus, the threshold value of the TFT 111 is corrected.

Thereafter, a data signal Vsig corresponding to luminance information is applied to the signal line SGL, whereby the signal is written to the second node ND112 via the TFT 112. At this time, the writing is performed while a current is passed through the TFT 111, so that mobility correction is performed in a simultaneous and parallel manner.

Then, the TFT 112 is set in a non-conducting state, and the light emitting element 113 is made to emit light according to the luminance information.

In the display device 100 according to the present embodiment, the following measure is taken to remedy nonuniformity such as shading or the like attendant on a voltage drop or the like in the power supply line to the pixel circuit 101, which nonuniformity occurs as nonuniformity or graininess of an image, that is, to improve picture quality or the like.

Figure 9:
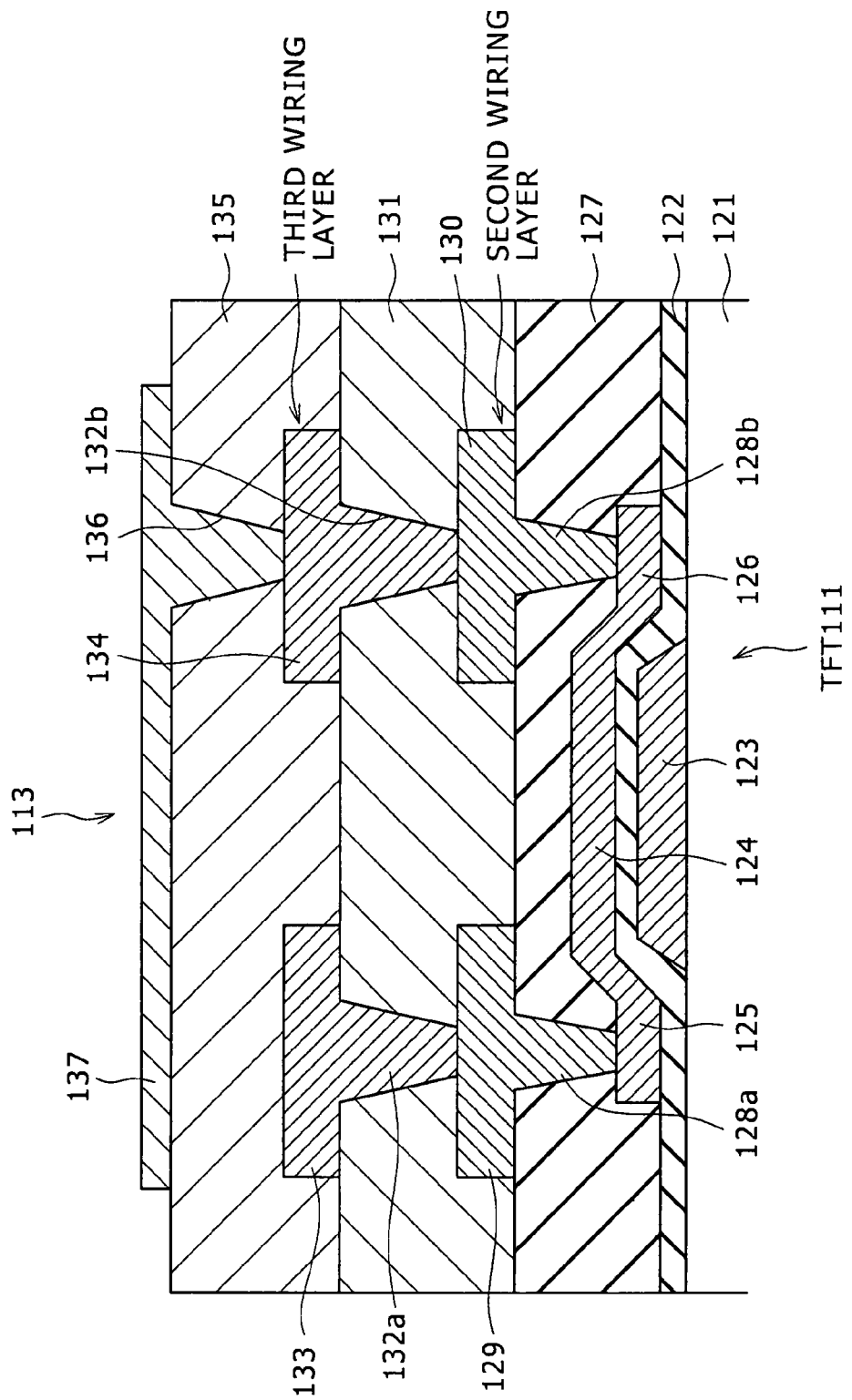

FIG. 9 is a sectional view of assistance in explaining an example of the measure to improve picture quality or the like.

In the present example of the measure, the power supply line PSL as wiring for power supply which wiring is connected with the drain as a first electrode of the TFT 111 as the driving transistor in each pixel circuit 101 is formed by a low-resistance metal, for example, aluminum (Al), and is formed as multilayer wiring.

In parallel with this, wiring layers connected to the source as a second electrode of the TFT 111 are formed as multilayer wiring of the same material and in the same layers as the power driving line PSL. The source electrode connected with the multilayer wiring is connected to the anode electrode of the light emitting element 113.

Incidentally, the TFT 111 and the TFT 112 in each pixel circuit 101 in the present embodiment are of a bottom gate type, and the gate electrode (control terminal) of the TFT 111 and the TFT 112 is formed as a first wiring layer on a lower layer side in a direction of layer lamination.

Generally, the gate electrode of the TFT is formed by making a film of a high-resistance wiring, for example, a metal such as molybdenum (Mo), tantalum (Ta) or the like or an alloy thereof by a method such as sputtering or the like.

The concrete configuration will be described.

For example, as shown in FIG. 9, the TFT 111 of a bottom gate structure has a gate electrode 123 as a first wiring layer covered with a gate insulating film 122 on a transparent insulating substrate (for example, a glass substrate) 121. The gate electrode 123 is connected to the second node ND112.

As described above, the gate electrode is formed by making a film of a metal such as molybdenum (Mo), tantalum (Ta) or the like or an alloy thereof by a method such as sputtering or the like.

The TFT 111 has a semiconductor film (channel forming region) 124 formed on the gate insulating film 122, and a pair of n+ diffused layers 125 and 126 with the semiconductor film 124 interposed between the n+ diffused layers 125 and 126.

An insulating film 127 made of an oxide film formed by SiO$_2$, for example, is formed so as to cover the gate insulating film 122, the channel forming region 124, and the n+ diffused layers 125 and 126.

Incidentally, though not shown in this figure, an n− diffused layer (LDD) is formed between the channel forming region 124 and each of the n+ diffused layers 125 and 126. The n+ diffused layer 125 forms the drain diffused layer (corresponding to the first electrode) of the TFT 111. The n+ diffused layer 126 forms the source diffused layer (corresponding to the second electrode) of the TFT 111.

One n+ diffused layer 125 is connected with a drain electrode 129 as a second wiring layer for the first electrode via a contact hole 128*a* formed in the insulating film 127. The other n+ diffused layer 126 is connected with a source electrode 130 as a second wiring layer for the second electrode via a contact hole 128*b* formed in the insulating film 127.

The drain electrode 129 and the source electrode 130 are formed by patterning aluminum (Al) of low resistance, for example.

An interlayer film 131 as a planarizing layer is formed so as to cover the drain electrode 129, the source electrode 130, and the insulating film 127.

The interlayer film 131 is formed by, for example, an oxide film, a polyimide, an acrylic resin, or a photosensitive resin.

The drain electrode 129 is connected with a third wiring layer 133 as the power driving line PSL via a contact hole 132*a* formed in the interlayer film 131. The drain electrode 130 is connected with a third wiring layer 134 for the second electrode via a contact hole 132*b* formed in the interlayer film 131.

The third wiring layers 133 and 134 can be formed by patterning aluminum (Al), for example, or can be formed by a same material as that of an anode electrode layer as a still higher layer, for example, silver (Ag) or the like.

A planarizing film 135 is formed so as to cover the third wiring layers 133 and 134 and the interlayer film 131.

The third wiring layer 134 for the second electrode is connected with an anode electrode layer 137 of the light emitting element 113 via a contact hole 136 formed in the planarizing film 135.

Incidentally, when a planarizing film is used as the interlayer film 131 between the second wiring layers 129 and 130 and the third wiring layers 133 and 134 in the above-described configuration, there is a fear of a chamber contamination at a time of forming a film of the third wiring layers (sputtering).

Accordingly, by employing a same material as that of the anode electrode layer 137, for example, Ag for the third wiring layers 129 and 130, an existing process can be used.

The number of manufacturing process steps may be increased when lower resistance is achieved by forming the power driving line PSL and the source electrode as multilayer wiring. In order to reduce the number of steps, multilayer wiring can be performed with a photosensitive resin used as the interlayer film 131, for example.

That is, when multilayer wiring is performed using a photosensitive resin, by using a photosensitive resin as the interlayer film 131 between the second wiring layer and the third wiring layer, the number of steps can be reduced, and multilayer wiring is made possible in a short cycle time and at a low cost. When an oxide film is used as the interlayer film 131, at least four steps of film formation, photolithography, etching, and resist stripping are demanded. The photosensitive resin demands only photolithography.

When multilayer wiring is performed in the pixel circuit, and a photosensitive resin is used as the interlayer film 131, the interlayer film may be worn away at a time of etching of the upper layer wiring, and thus the coating property of the planarizing film 135 may be affected.

Accordingly, the present embodiment prevents the coating property of the planarizing film 135 from being affected even if the interlayer film 131 is worn away by setting the wiring thickness of the third wiring layer 133 and 134 as follows.

Specifically, letting tp be the film thickness of the planarizing film, tl be the film thickness of the third wiring layer, and A be the constant of a material for the interlayer film, the thickness of the third wiring layer 133 and 134 is set so as to satisfy the following relation:

(Equation 2)

$$tl = tp/(1+A) \tag{2}$$

Figure 10:
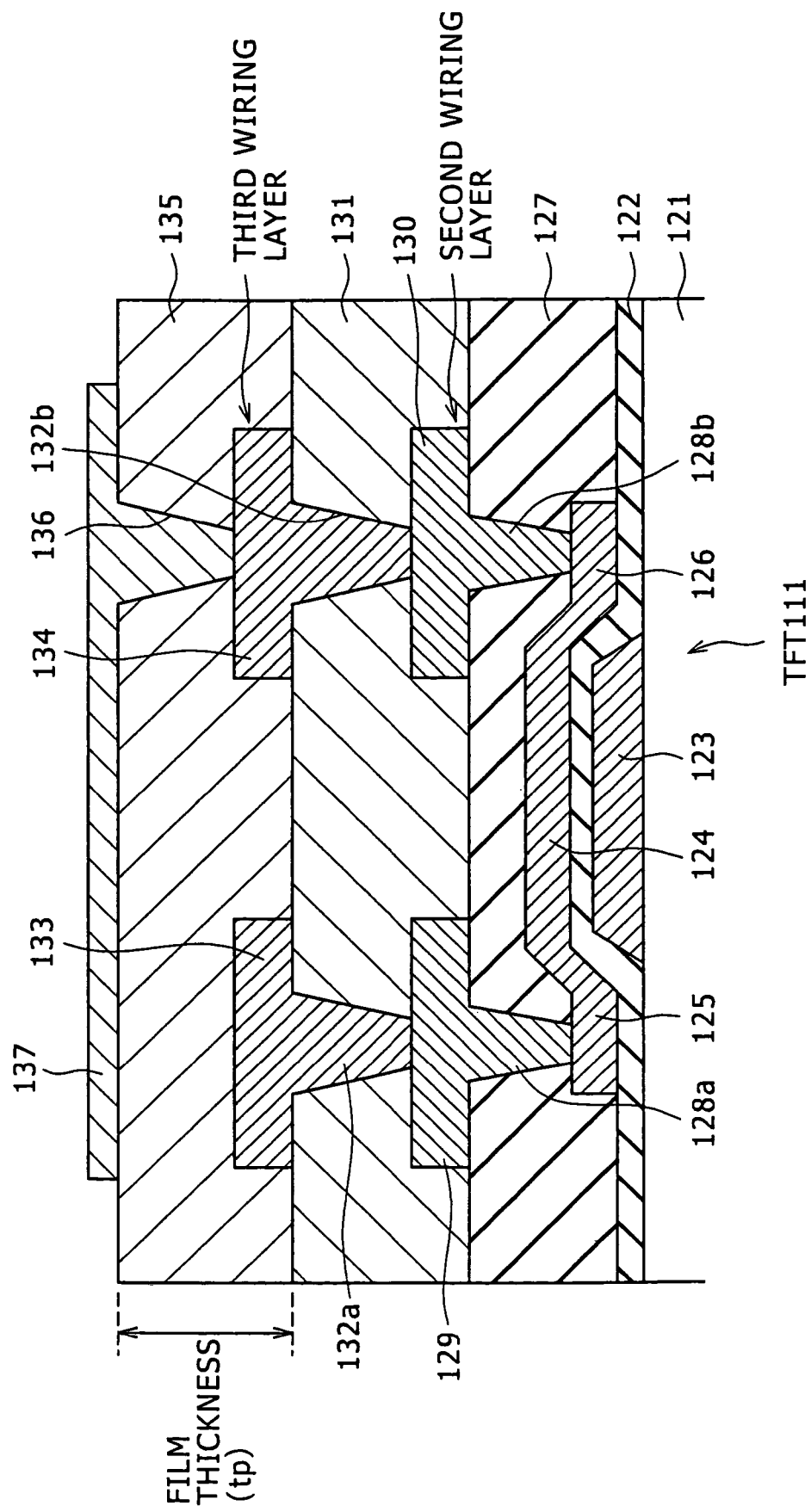
FIG. 10 is a diagram showing a multilayer wiring structure when a photosensitive resin is used as interlayer film.

FIG. 10 is a diagram showing a multilayer wiring structure when a photosensitive resin is used as the interlayer film.

Figure 11:
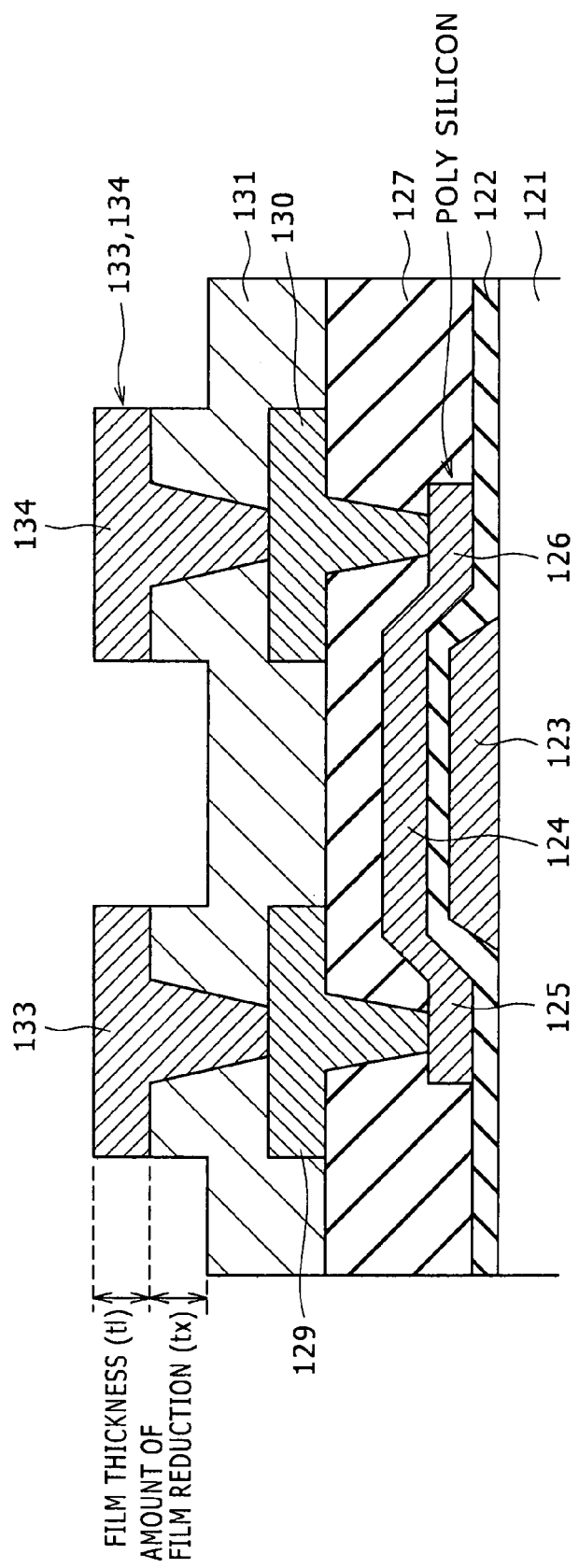
FIG. 11 is a diagram showing a state in which the interlayer film is reduced at a time of etching of the upper layer wiring.

FIG. 11 shows a state in which the interlayer film is reduced at a time of etching of upper layer wiring.

When the film reduction occurs, an actual difference in level at a time of coating with the planarizing film 135 is more than the film thickness of the wiring, thus degrading the coating property. Alternatively, the material for the planarizing film 135 is used in large quantity, thus presenting a problem in terms of cost.

Letting tp be the thickness of the planarizing film, tl be the thickness of the wiring film, and tx be an amount of film reduction, $tp \geq tl+tx$ suffices for normal coating with the planarizing film.

The amount of film reduction is proportional to the thickness of the wiring film, so that a relation $tx=A \times tl$ holds (A is a constant, and depends on the material for the interlayer film). Thus, by setting $tl=tp/(1+A)$, even if film reduction occurs, the property of coating the interlayer film 131 is not affected.

A method of manufacturing the part of the pixel circuit having such a configuration will next be described.

Description in the following will be made of two methods using an oxide film as interlayer film 131 and using a photosensitive resin as interlayer film 131.

The manufacturing method using an oxide film as interlayer film 131 will first be described with reference to FIGS. 12A to 12J.

Figure 12A:
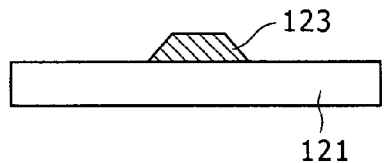
FIGS. 12A to 12J are diagrams of assistance in explaining a manufacturing method in a case where an oxide film is used as an interlayer film.

As shown in FIG. 12A, a gate electrode 123 as a first wiring layer is formed on a transparent insulating substrate (for example, a glass substrate) 121.

As described above, the gate electrode 123 is formed by making a film of a high-resistance wiring, for example, a metal such as molybdenum (Mo), tantalum (Ta) or the like or an alloy thereof by a method such as sputtering or the like.

Figure 12B:
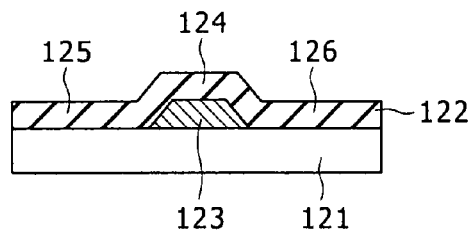

Next, as shown in FIG. 12B, after a gate insulating film 122 is formed by $SiO_2$, a film of amorphous silicon is formed and made into polycrystalline silicon to form a channel forming region 124 and n+ diffused layers 125 and 126 (a drain and a source).

Figure 12C:
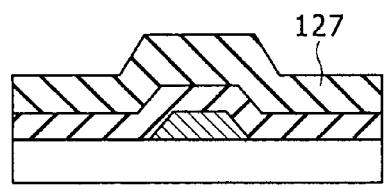

Next, as shown in FIG. 12C, an insulating film 127 is formed by $SiO_2$.

Figure 12D:
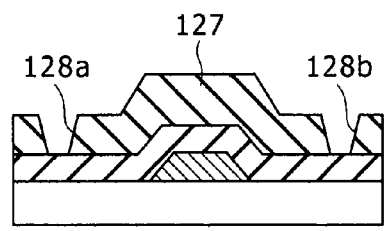

As shown in FIG. 12D, contact holes 128a and 128b reaching the drain 125 and the source 126 are made in the insulating film 127.

Figure 12E:
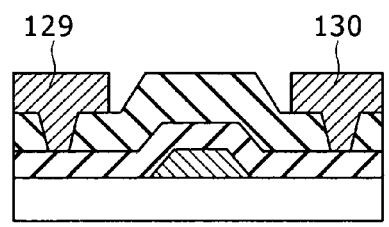

Then, as shown in FIG. 12E, a drain electrode 129 as a second wiring layer for the first electrode is formed in such a manner as to be connected to the drain 125 via the contact hole 128a formed in the insulating film 127, and a source electrode 130 as a second wiring layer for the second electrode is formed in such a manner as to be connected to the source 126 via the contact hole 128b formed in the insulating film 127.

The drain electrode 129 and the source electrode 130 are formed by patterning aluminum (Al) of low resistance, for example.

Figure 12F:
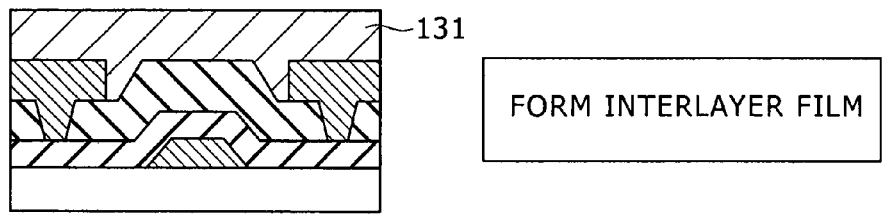

Next, as shown in FIG. 12F, an interlayer film 131 is formed by $SiO_2$.

Figure 12G:
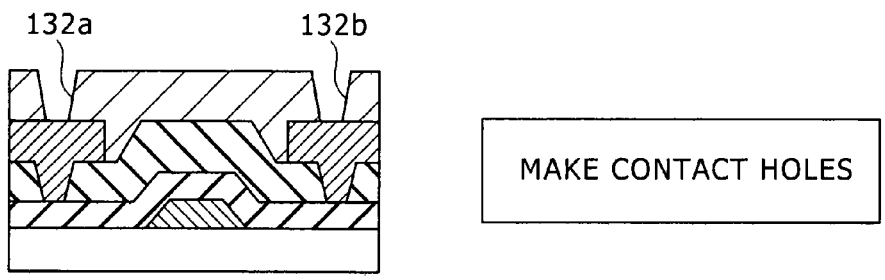

As shown in FIG. 12G, contact holes 132a and 132b, reaching the drain electrode 129 and the source electrode 130, are made in the interlayer film 131.

Figure 12H:
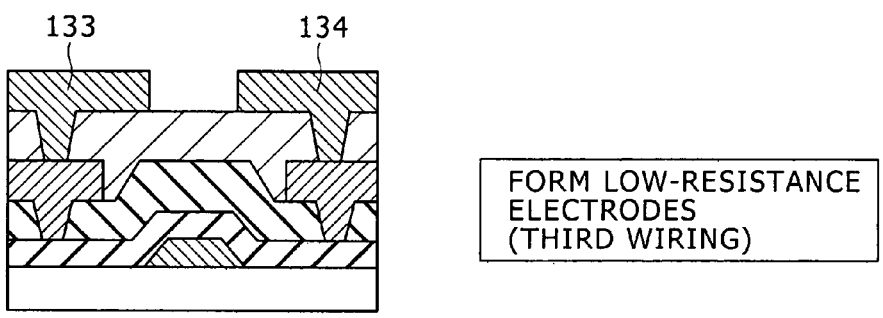

Then, as shown in FIG. 12H, a third wiring layer 133 as a power supply line PSL is formed in such a manner as to be connected to the drain electrode 129 via the contact hole 132a formed in the interlayer film 131, and a third wiring layer 134 for the second electrode is formed in such a manner as to be connected to the source electrode 130 via the contact hole 132b formed in the interlayer film 131.

The third wiring layers 133 and 134 can be formed by patterning aluminum (Al), for example, or can be formed by a same material as that of an anode electrode layer as a still higher layer, for example, silver (Ag) or the like.

Figure 12I:
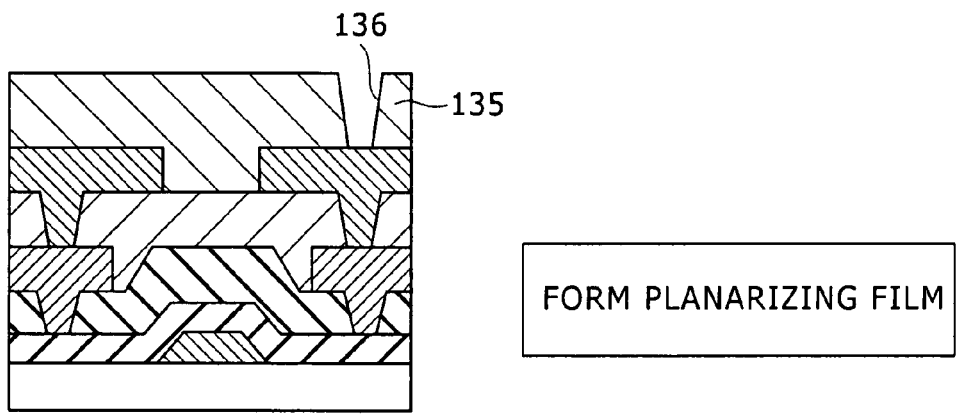

Next, as shown in FIG. 12I, a planarizing film 135 is formed so as to cover the third wiring layers 133 and 134 and the interlayer film 131. A contact hole 136 reaching the wiring layer 134 is then made in the planarizing film 135.

Figure 12J:
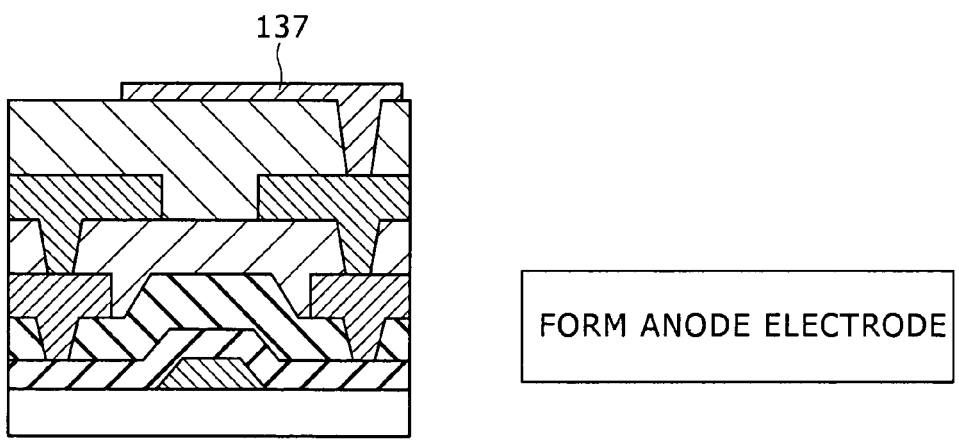

Then, as shown in FIG. 12J, an anode electrode layer 137 of a light emitting element 113 is formed in such a manner as to be connected to the third wiring layer 134 via the contact hole 136 formed in the planarizing film 135.

The manufacturing method using a photosensitive resin as interlayer film 131 will next be described with reference to FIGS. 13A to 13I.

Figure 13A:
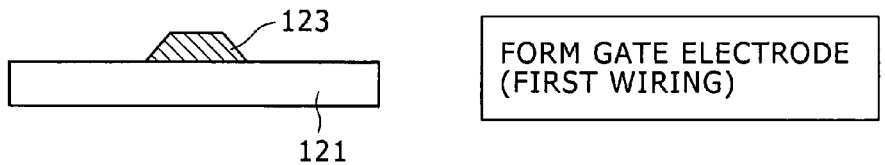
FIGS. 13A to 13I are diagrams of assistance in explaining a manufacturing method in a case where a photosensitive resin is used as an interlayer film.

As shown in FIG. 13A, a gate electrode 123 as a first wiring layer is formed on a transparent insulating substrate (for example, a glass substrate) 121.

As described above, the gate electrode 123 is formed by making a film of a high-resistance wiring, for example, a metal such as molybdenum (Mo), tantalum (Ta) or the like or an alloy thereof by a method such as sputtering or the like.

Figure 13B:
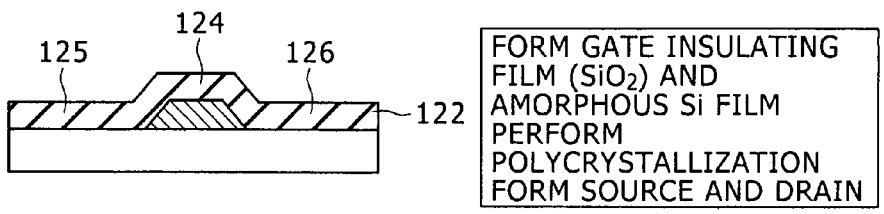

Next, as shown in FIG. 13B, after a gate insulating film 122 is formed by $SiO_2$, a film of amorphous silicon is formed and made into polycrystalline silicon to form a channel forming region 124 and n+ diffused layers 125 and 126 (a drain and a source).

Figure 13C:
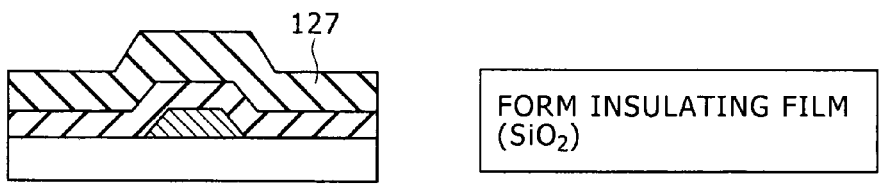

Next, as shown in FIG. 13C, an insulating film 127 is formed by $SiO_2$.

Figure 13D:
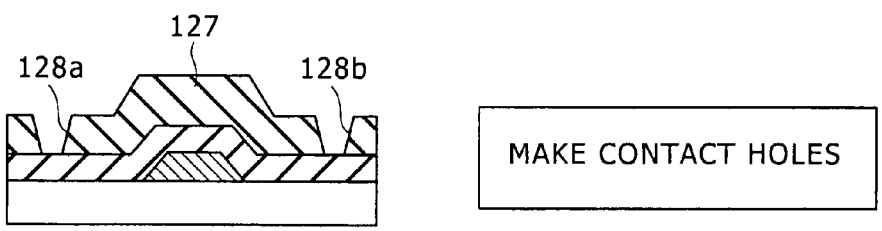

As shown in FIG. 13D, contact holes 128a and 128b reaching the drain 125 and the source 126 are made in the insulating film 127.

Figure 13E:
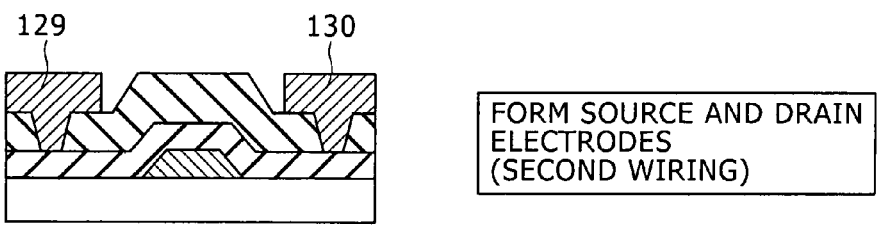

Then, as shown in FIG. 13E, a drain electrode 129 as a second wiring layer for the first electrode is formed in such a manner as to be connected to the drain 125 via the contact hole 128a formed in the insulating film 127, and a source electrode 130 as a second wiring layer for the second electrode is formed in such a manner as to be connected to the source 126 via the contact hole 128b formed in the insulating film 127.

The drain electrode 129 and the source electrode 130 are formed by patterning aluminum (Al) of low resistance, for example.

Figure 13F:
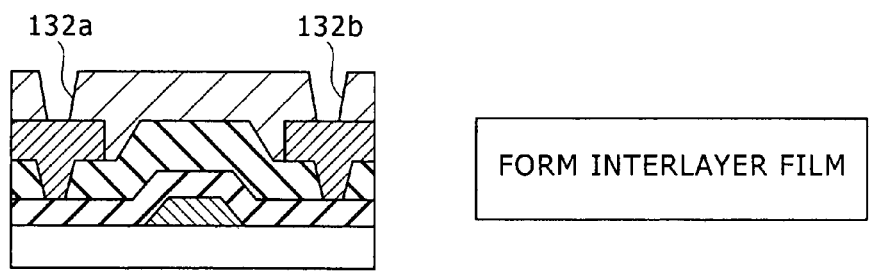

Next, as shown in FIG. 13F, an interlayer film 131 is formed by a photosensitive resin, and contact holes 132a and 132b reaching the drain electrode 129 and the source electrode 130 are made in the interlayer film 131.

When a photosensitive resin is thus used as interlayer film 131, processing can be performed in a simultaneous and parallel manner including a step of forming the contact holes, and therefore the number of steps can be reduced as compared with the above-described case of using an oxide film as interlayer film. That is, the two steps of FIGS. 12F and 12G can be performed in only one step.

Figure 13G:
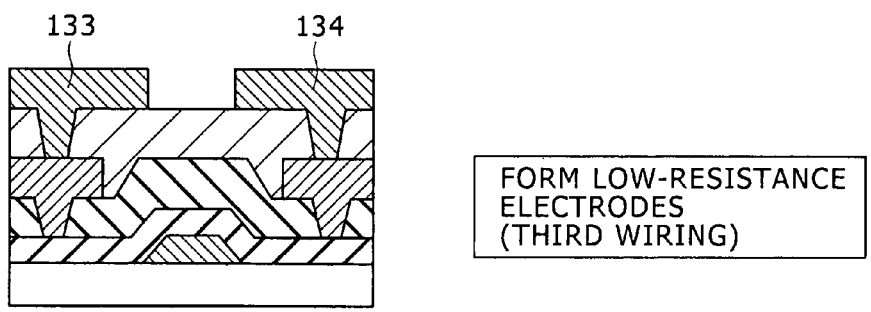

Then, as shown in FIG. 13G, a third wiring layer 133 as a power supply line PSL is formed in such a manner as to be connected to the drain electrode 129 via the contact hole 132a formed in the interlayer film 131, and a third wiring layer 134 for the second electrode is formed in such a manner as to be connected to the source electrode 130 via the contact hole 132b formed in the interlayer film 131.

The third wiring layers 133 and 134 can be formed by patterning aluminum (Al), for example, or can be formed by a same material as that of an anode electrode layer as a still higher layer, for example, silver (Ag) or the like.

Figure 13H:
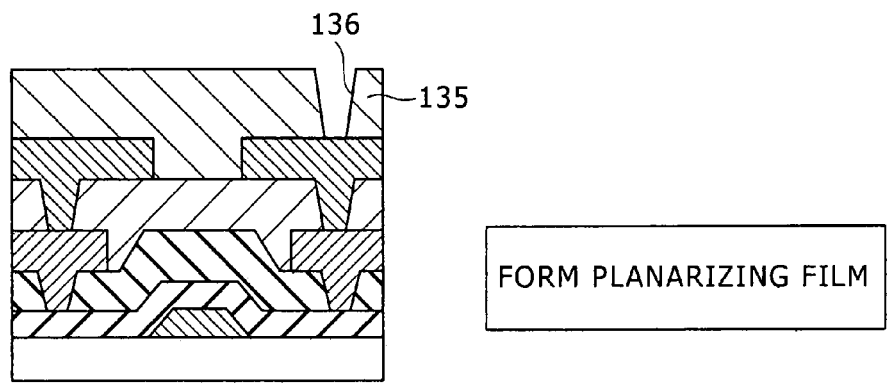

Next, as shown in FIG. 13H, a planarizing film 135 is formed so as to cover the third wiring layers 133 and 134 and the interlayer film 131. A contact hole 136 reaching the third wiring layer 134 is then made in the planarizing film 135.

Figure 13I:
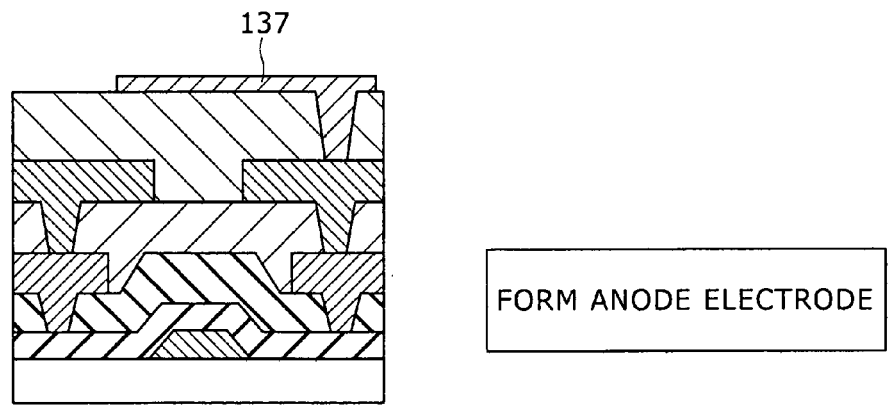

Then, as shown in FIG. 13I, an anode electrode layer 137 of a light emitting element 113 is formed in such a manner as to be connected to the third wiring layer 134 via the contact hole 136 formed in the planarizing film 135.

A more concrete operation of the above-described configuration will next be described centering on the operation of the pixel circuit with reference to FIGS. 14A to 14E and FIGS. 15 to 22.

FIG. 14A shows a gate pulse (scanning pulse) GP applied to the scanning line WSL. FIG. 14B shows a power signal PSG applied to the power driving line PSL. FIG. 14C shows an input signal SIN applied to the signal line SGL. FIG. 14D shows the potential VND112 of the second node ND112. FIG. 14E shows the potential VND111 of the first node ND111.

Figure 15:
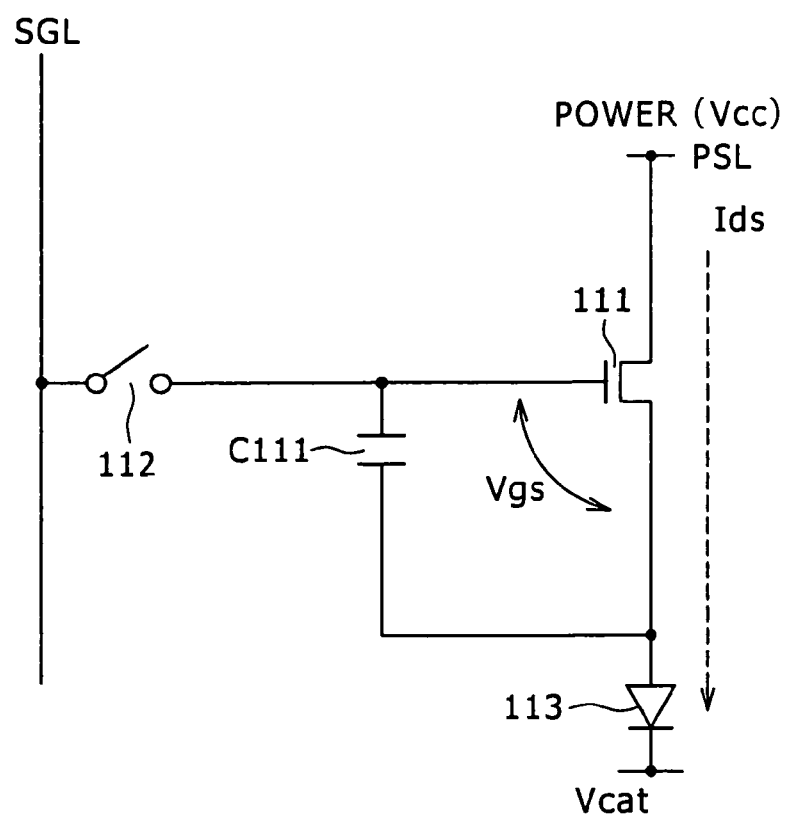
FIG. 15 is a diagram of assistance in explaining an operation of the pixel circuit of FIG. 7, and is a diagram showing a state during an emission period.

First, during a light emitting state of the light emitting element 113, as shown in FIG. 14A and FIG. 15, the power driving line PSL is at a power supply voltage Vcc, and the TFT 112 is in an off state.

At this time, because the TFT 111 as a driving transistor is set to operate in a saturation region, the current Ids flowing through the EL light emitting element 113 assumes a value expressed by Equation 1 according to the gate-to-source voltage Vgs of the TFT 111.

Figure 16:
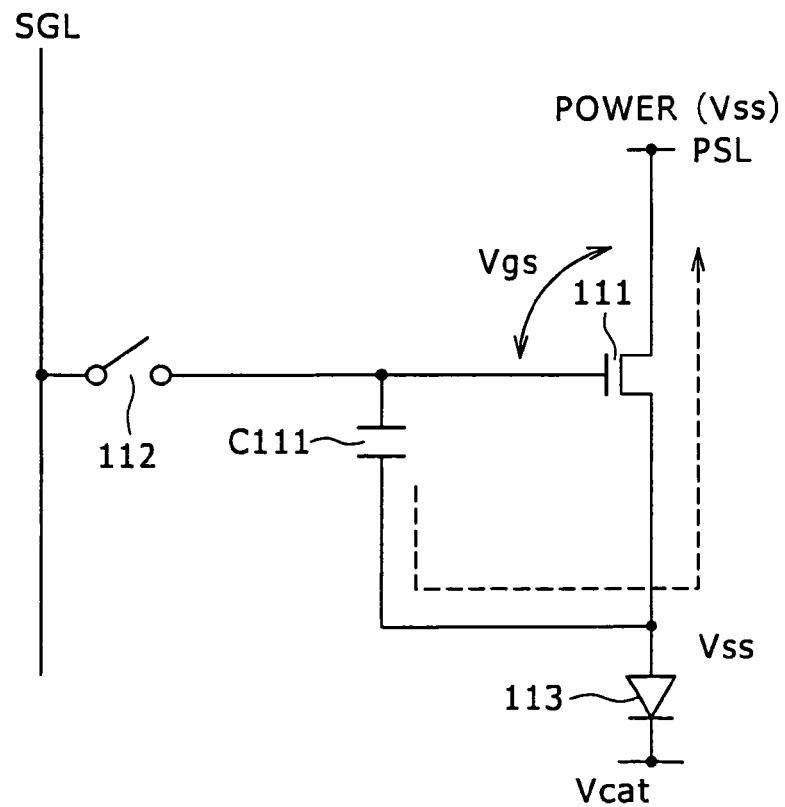
FIG. 16 is a diagram of assistance in explaining an operation of the pixel circuit of FIG. 7, and is a diagram showing a state in which a voltage Vss is set during a non-emission period.
Figure 17:
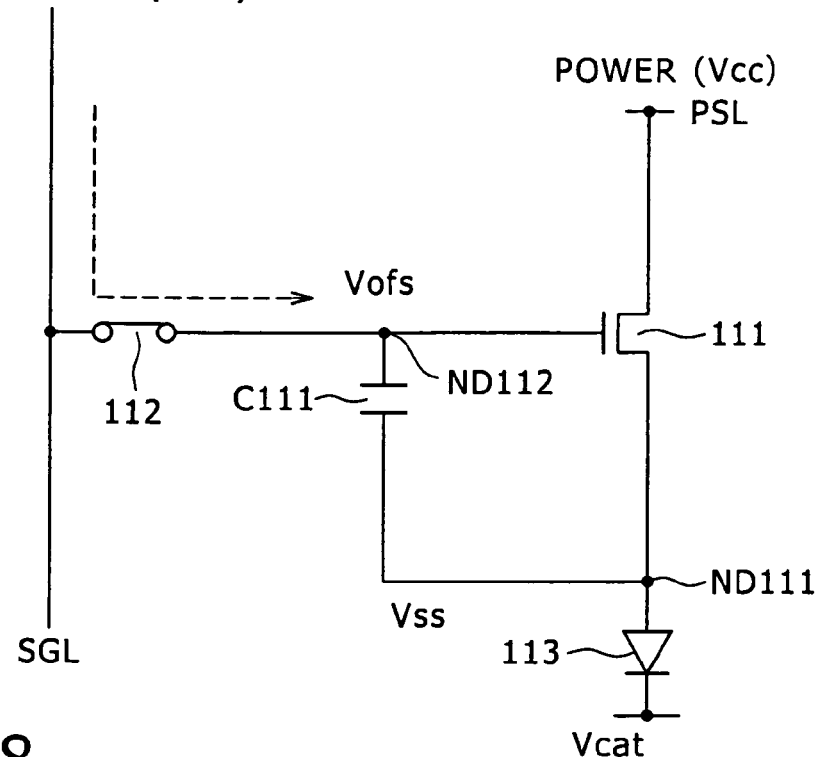
FIG. 17 is a diagram of assistance in explaining an operation of the pixel circuit of FIG. 7, and is a diagram showing a state in which an offset signal is input.

Next, in a non-emission period, as shown in FIG. 14B and FIG. 16, the power driving line PSL as a power supply line is set at a voltage Vss. At this time, when the voltage Vss is lower than a sum of the threshold value Vthel of the light emitting element 113 and a cathode voltage Vcat, that is, Vss<Vthel+Vcat, the light emitting element 113 is quenched, and the power driving line PSL as a power supply line becomes the source of the TFT 111 as a driving transistor. At this time, as shown in FIG. 14E, the anode (node ND111) of the EL light emitting element 113 is charged to the voltage Vss.

Further, as shown in FIGS. 14A, 14C, 14D, and 14E and FIG. 17, with the signal line SGL at an offset voltage Vofs, the gate pulse GP is set at a high level to turn on the TFT 112, whereby the gate potential of the TFT 111 is set at the offset voltage Vofs.

At this time, the gate-to-source voltage of the TFT 111 assumes a value (Vofs−Vss). A threshold value correcting operation may not be performed when the gate-to-source voltage (Vofs−Vss) of the TFT 111 is not higher than (is lower than) the threshold voltage Vth of the TFT 111. It is therefore necessary that the gate-to-source voltage (Vofs−Vss) of the TFT 111 is higher than the threshold voltage Vth of the TFT 111, that is, Vofs−Vss>Vth.

Then, the power signal PSG applied to the power driving line PSL in the threshold value correcting operation is set at the power supply voltage Vcc again.

Figure 18:
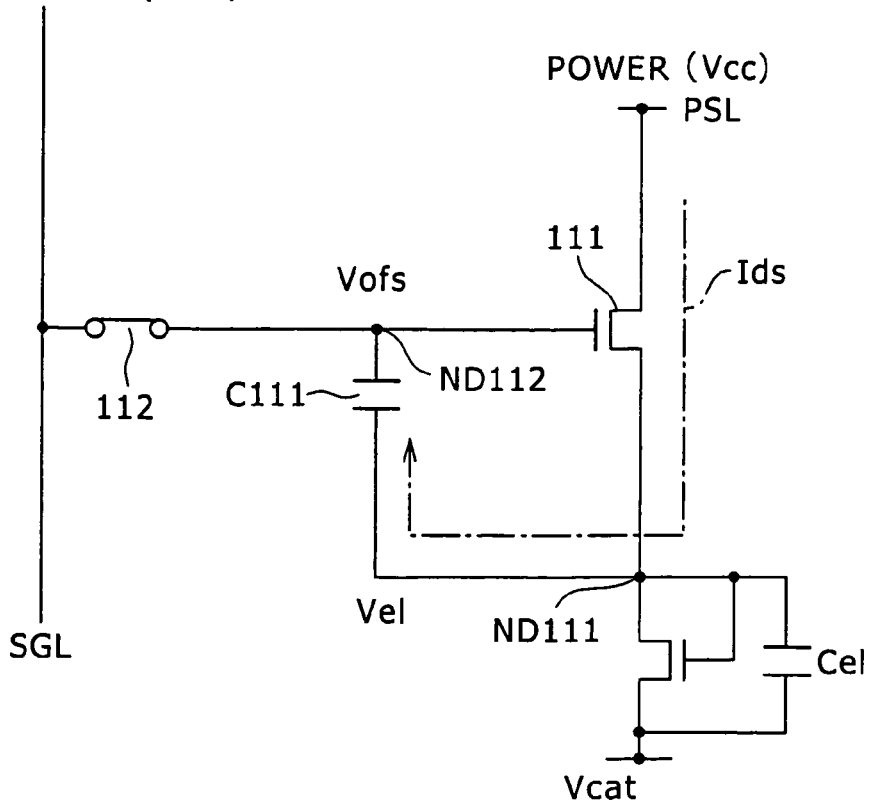
FIG. 18 is a diagram of assistance in explaining an operation of the pixel circuit of FIG. 7, and is a diagram showing a state in which a voltage Vcc is set.

By setting the power driving line PSL at the power supply voltage Vcc, the anode (node ND111) of the EL light emitting element 113 functions as the source of the TFT 111, and a current flows, as shown in FIG. 18.

An equivalent circuit of the EL light emitting element 113 is represented by a diode and a capacitance as shown in FIG. 18. Thus, as long as a relation Vel≦Vcat+Vthel (a leakage current of the EL light emitting element 113 is considerably smaller than a current flowing through the TFT 111) is satisfied, the current of the TFT 111 is used to charge the capacitors C111 and Cel.

Figure 19:
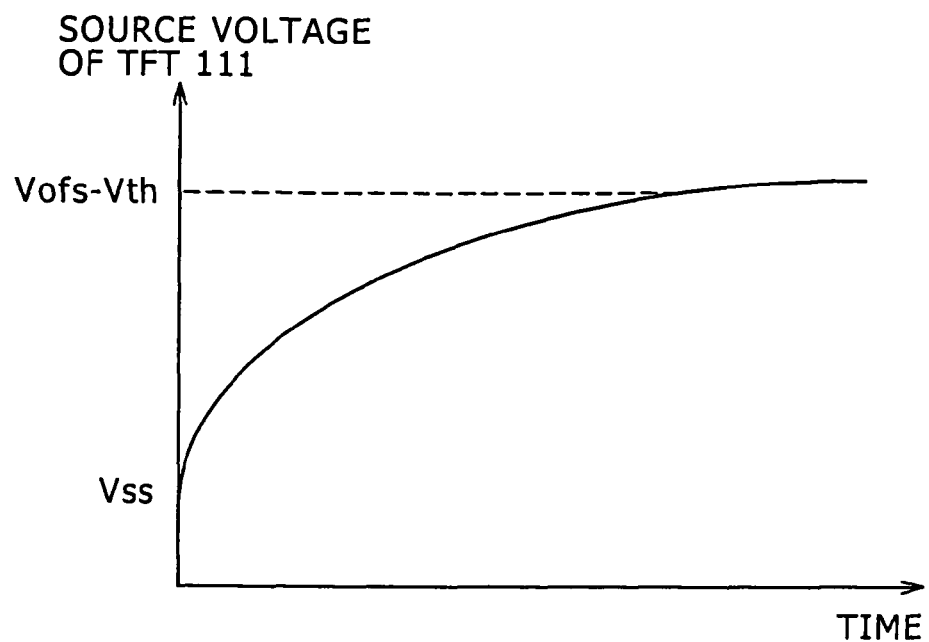
FIG. 19 is a diagram of assistance in explaining an operation of the pixel circuit of FIG. 7, and is a diagram showing a transition of the source voltage of the driving transistor when the voltage Vcc is set.

At this time, a voltage Vel across the capacitance Cel rises with time, as shown in FIG. 19. After the passage of a certain time, the gate-to-source voltage of the TFT 111 assumes the value Vth. At this time, Vel=Vofs−Vth≦Vcat+Vthel.

Figure 20:
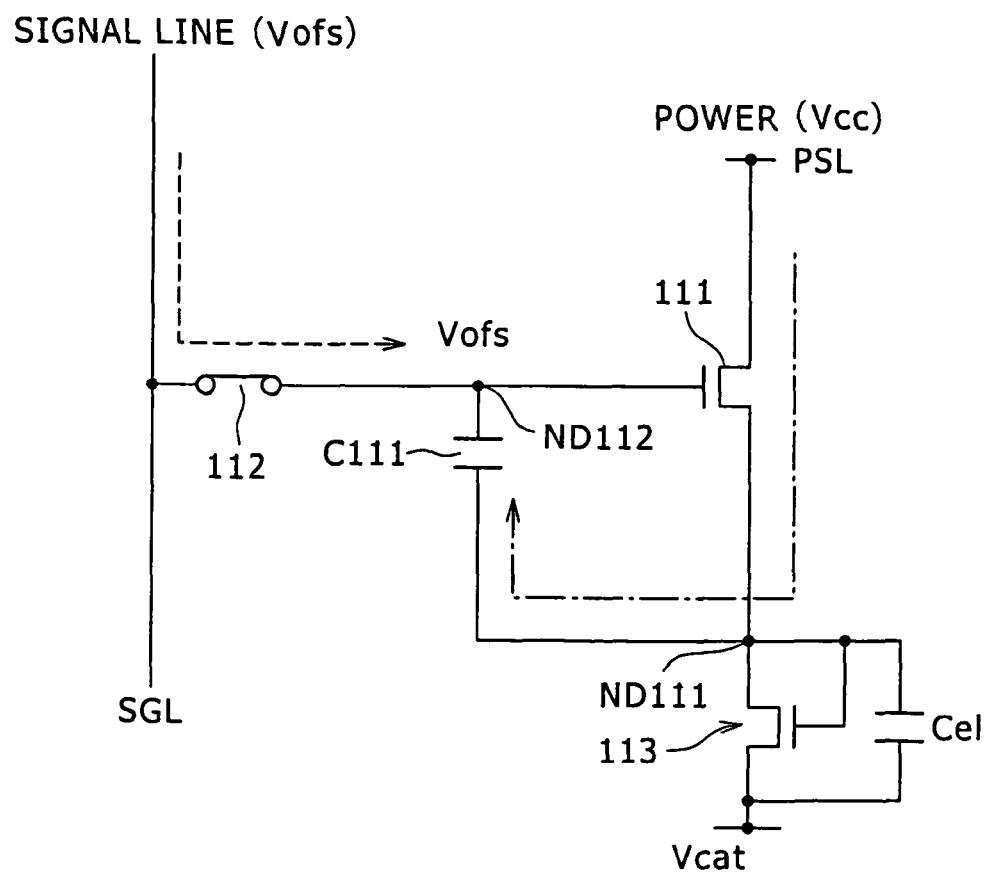
FIG. 20 is a diagram of assistance in explaining an operation of the pixel circuit of FIG. 7, and is a diagram showing a state when a data signal Vsig is written.

After the threshold value canceling operation is ended, as shown in FIGS. 14A and 14C and FIG. 20, the signal line SGL is set at a potential Vsig with the TFT 112 in an on state. The data signal Vsig is a voltage corresponding to a gradation level. At this time, as shown in FIG. 14D, the gate potential of the TFT 111 is the potential Vsig because the TFT 112 is on.

The source potential rises with time because the current Ids flows from the power driving line PSL as a power supply line.

At this time, when the source voltage of the TFT 111 does not exceed a sum of the threshold voltage Vthel of the EL light emitting element 113 and the cathode voltage Vcat (when the leakage current of the EL light emitting element 113 is considerably smaller than the current flowing through the TFT 111), the current flowing through the TFT 111 is used to charge the capacitors C111 and Cel.

At this time, because the operation of correcting the threshold value of the TFT 111 has been completed, the current passed by the TFT 111 reflects mobility p.

Figure 21:
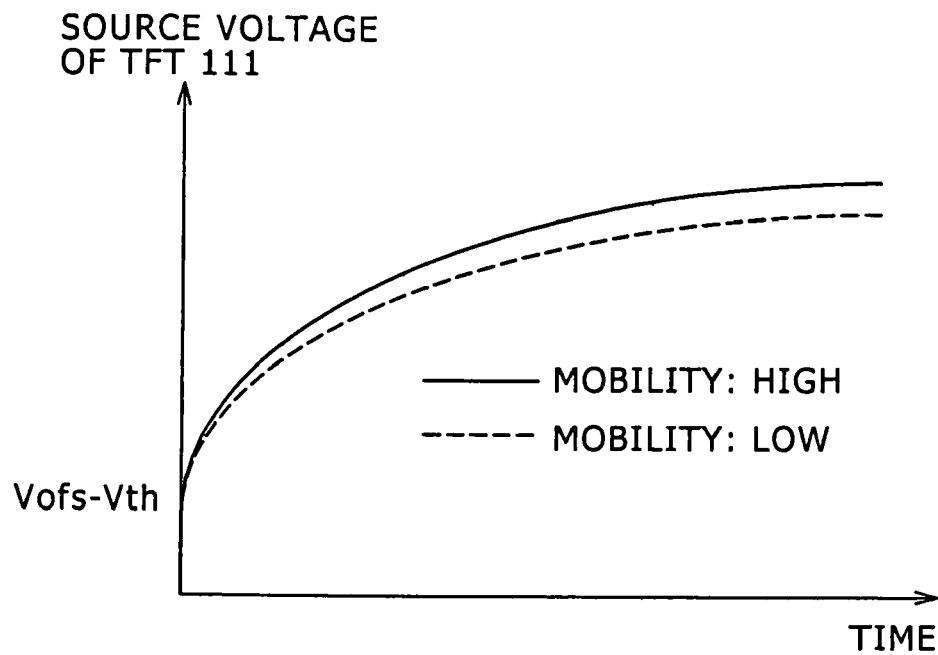
FIG. 21 is a diagram of assistance in explaining an operation of the pixel circuit of FIG. 7, and is a diagram showing transitions of the source voltage of the driving transistor in correspondence with high mobility and low mobility.

Specifically, as shown in FIG. 21, when the mobility μ is high, an amount of current at this time is large, and the source voltage rises quickly. Conversely, when the mobility μ is low, the amount of current is small, and the source voltage rises slowly. Thus, the gate-to-source voltage of the TFT 111 is decreased reflecting the mobility μ, and becomes the gate-to-source voltage Vgs that completely corrects the mobility after the passage of a certain time.

Finally, as shown in FIGS. 14A to 14C and FIG. 22, the gate pulse GP is changed to a low level to turn off the TFT 112 and thereby end writing, and the EL light emitting element 113 is made to emit light.

Because the gate-to-source voltage of the TFT 111 is constant, the TFT 111 sends a constant current Ids' to the EL light emitting element 113, the voltage Vel rises to a voltage Vx at which the current Ids' flows through the EL light emitting element 113, and the EL light emitting element 113 emits light.

Figure 22:
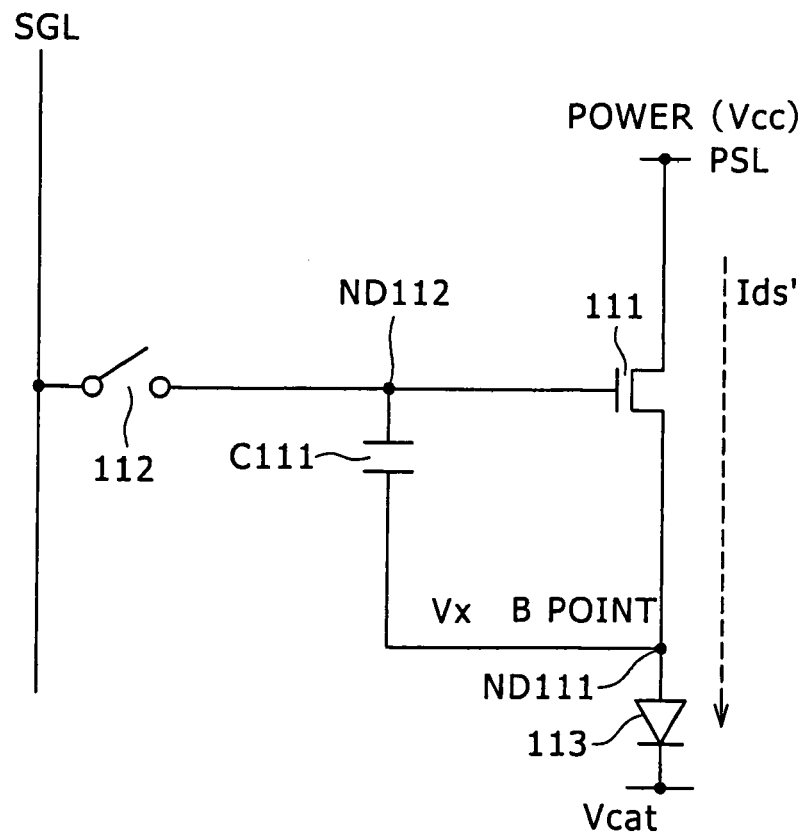
FIG. 22 is a diagram of assistance in explaining an operation of the pixel circuit of FIG. 7, and is a diagram showing an emission state.

Also in the pixel circuit 101, the I-V characteristic of the light emitting element 113 is changed as a light emission time is lengthened. Therefore, the potential of a point B (node ND111) in FIG. 22 is also changed. However, the gate-to-source voltage of the TFT 111 is maintained at a constant value, and thus the current flowing through the EL light emitting element 113 does not change. Thus, even when the I-V characteristic of the light emitting element 113 is degraded, the constant current Ids flows at all times, and therefore the luminance of the light emitting element 113 does not change.

In the thus driven pixel circuit, the power supply line is made into a two-stage wiring structure to achieve a low resistance, and nonuniformity such as shading or the like attendant on a voltage drop, which nonuniformity occurs as nonuniformity or graininess of an image, can be remedied.

According to the present embodiment, the display device including the organic EL (Electro-Luminescence) element has functions of correcting for variations in the threshold value of the transistor, correcting for variations in mobility, and correcting for secular variations of the organic EL light emitting element, so that high picture quality can be obtained. Further, in addition to the ability to achieve high definition, because of the small number of elements, low-resistance wiring is achieved by performing multilayer wiring using an existing process, so that a display device offering excellent picture quality can be obtained.

Further, in addition to the ability to achieve high definition, because of the small number of elements, low-resistance wiring is achieved by performing multilayer wiring using a photosensitive resin, so that a display device offering excellent picture quality can be obtained.

Further, in the case of using the photosensitive resin, letting tp be the film thickness of the planarizing film, tl be the film thickness of the third wiring layer, and A be the constant of a material for the interlayer film, by making a configuration such that the relation tl=tp/(1+A) is satisfied, multilayer wiring can be realized without the coating property of the planarizing film being affected even when the interlayer film is reduced.

In the present embodiment, the above description has been made of an example of an effective measure to improve picture quality for the display device 100 having the circuit in FIG. 7, that is, a 2Tr+1C pixel circuit including two transistors and one capacitor.

However, while the example of the measure is effective for the display device 100 having the 2Tr+1C pixel circuit, the measure can also be applied to display devices having a pixel circuit of a configuration provided with a TFT or the like for mobility and threshold value cancellation separately in addition to a drive (driving) transistor connected in series with an OLED and a switching transistor.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
a pixel array unit in which a plurality of pixel circuits are formed, said pixel circuits each including a light emitting element, a power supply line, a driving transistor connected between said power supply line and a predetermined electrode of the light emitting element, and a switching transistor connected between a signal line and a gate electrode of said driving transistor;
a first scanner for supplying a potential to said power supply line; and
a second scanner for outputting a driving signal to said switching transistor;
wherein said power supply line is formed as multilayer wiring,
said driving transistor includes a gate electrode formed by a first wiring layer, a channel forming region, a gate insulating film formed between said gate electrode and said channel forming region, and a first electrode and a second electrode formed such that said channel forming region is interposed between the first electrode and the second electrode, and
said power supply line includes a second wiring layer formed so as to be connected to the first electrode of said driving transistor via a contact formed in an insulating film, and a third wiring layer formed so as to be connected to said second wiring layer via a contact formed in an interlayer film.

2. The display device according to claim 1,
wherein potential of said power supply line assumes a plurality of values.

3. The display device according to claim 1,
wherein said interlayer film is formed by a photosensitive resin.

4. The display device according to claim 1,
wherein said interlayer film is formed by a polyimide.

5. The display device according to claim 1, further comprising a planarizing film formed on said third wiring layer,
wherein letting tp be film thickness of said planarizing film, tl be film thickness of said third wiring layer, and A be a constant of a material for said interlayer film, a following relation is satisfied:

$$tl = tp/(1+A) \qquad \text{(Equation 1)}.$$

6. The display device according to claim 1,
wherein said second electrode is connected to the predetermined electrode of said light emitting element, and said third wiring layer is formed of a same material as said predetermined electrode.

7. A pixel circuit comprising:
a driving transistor;
a light emitting element; and
a power supply line;
wherein said driving transistor is connected between said power supply line and a predetermined electrode of said light emitting element,
said power supply line is formed as multilayer wiring, and an interpolating capacitance is formed such that the power supply line formed as said multilayer wiring and another conductive layer are opposed to each other at a distance,
said driving transistor includes a gate electrode formed by a first wiring layer, a channel forming region, a gate insulating film formed between said gate electrode and said channel forming region, and a first electrode and a second electrode formed such that said channel forming region is interposed between the first electrode and the second electrode, and
said power supply line includes a second wiring layer formed so as to be connected to the first electrode of said driving transistor via a contact formed in an insulating film, and a third wiring layer formed so as to be connected to said second wiring layer via a contact formed in an interlayer film.

8. The pixel circuit according to claim 7,
wherein potential of said power supply line assumes a plurality of values.

9. The pixel circuit according to claim 7,
wherein said interlayer film is formed by a photosensitive resin.

10. The pixel circuit according to claim 7,
wherein said interlayer film is formed by a polyimide.

11. The pixel circuit according to claim 7, further comprising a planarizing film formed on said third wiring layer,
wherein letting tp be film thickness of said planarizing film, tl be film thickness of said third wiring layer, and A be a constant of a material for said interlayer film, a following relation is satisfied:

$$tl = tp/(1+A) \qquad \text{(Equation 1)}.$$

12. The pixel circuit according to claim 7,
wherein said second electrode is connected to the predetermined electrode of said light emitting element, and said third wiring layer is formed of a same material as said predetermined electrode.

* * * * *